(12) United States Patent  
Maeno

(10) Patent No.: US 6,678,846 B1
(45) Date of Patent: Jan. 13, 2004

(54) SEMICONDUCTOR INTEGRATED CIRCUIT WITH A SCAN PATH CIRCUIT

(75) Inventor: Hideshi Maeno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 393 days.

(21) Appl. No.: 09/588,590

(22) Filed: Jun. 7, 2000

(30) Foreign Application Priority Data

Dec. 14, 1999 (JP) .......................................... 11-354999

(51) Int. Cl.$^7$ .............................................. G01R 31/28
(52) U.S. Cl. ..................................................... 714/726
(58) Field of Search ................ 714/726, 729, 714/727

(56) References Cited

U.S. PATENT DOCUMENTS

| | | | | |
|---|---|---|---|---|
| 5,600,787 A | * | 2/1997 | Underwood et al. | 714/30 |
| 5,617,427 A | * | 4/1997 | Ohta et al. | 714/729 |
| 5,903,579 A | * | 5/1999 | Osawa et al. | 714/726 |
| 5,905,737 A | * | 5/1999 | Osawa et al. | 714/726 |
| 6,275,963 B1 | * | 8/2001 | Maeno et al. | 714/726 |
| 6,393,592 B1 | * | 5/2002 | Peeters et al. | 714/731 |
| 6,420,896 B1 | * | 7/2002 | Maeno | 326/9 |

FOREIGN PATENT DOCUMENTS

JP          07-46122          5/1995

OTHER PUBLICATIONS

U.S. patent application No. 09/129,041 in the name of Mitsubishi Denki Kabushiki Kaisha, "Semiconductor Integrated Circuit Device", filed Aug. 4, 1998.

* cited by examiner

Primary Examiner—Albert Decady
Assistant Examiner—Joseph D. Torres
(74) Attorney, Agent, or Firm—Burns, Doane, Swecker & Mathis, LLP

(57) ABSTRACT

A semiconductor integrated circuit comprises a logic circuit to be tested by a scan test; and a scan path circuit being constituted by serially connecting a plurality of scan register circuits, each of which includes a compound gate circuit having a first logic gate and a second logic gate, a flip-flop circuit connecting an output of the compound gate circuit to a data input terminal, and a gate circuit connecting a first input thereof to a data output terminal of the flip-flop circuit and connecting a second input thereof to a second connection terminal input by a second shift mode signal, and which connects the compound gate circuit, flip-flop circuit, and gate circuit in this turn, wherein a first input of the first logic gate is connected to the logic circuit to be tested, and a second input thereof is connected to a first connection terminal input by a first shift mode signal, while a first input of the logic gate is connected to an output of the first logic gate and a second input thereof is connected to a serial input terminal.

9 Claims, 23 Drawing Sheets

FIG.11

| MODE NAME / TERMINAL NAME | TMSI | TMFB | CMP0L | CMP1L |
|---|---|---|---|---|
| NORMAL (CAPTURE) | 1 | 1 | 1 | 0 |
| HOLD | 1 | 0 | 1 | 1 |
| SHIFT | 0 | 1 | 1 | 1 |
| RAM TEST | 1 | 0 | exp | $\overline{\text{exp}}$ |
| SET 1 | 1 | 1 | 1 | 1 |

US 6,678,846 B1

SEMICONDUCTOR INTEGRATED CIRCUIT WITH A SCAN PATH CIRCUIT

BACKGROUND OF THE INVENTION

1. Field of the Invention

The present invention relates to a semiconductor integrated circuit with a scan path circuit and a device using the same. More specifically, it relates to an electric system that is designed to facilitate a scan path test with respect to a logic circuit.

2. Description of the Prior Art

FIG. 21 is circuit diagram showing a semiconductor integrated circuit with a scan path circuit as one example of a conventional electric system. In FIG. 21, the reference numeral 1' designates a scan path circuit; 5' designates a logic circuit to be tested; 11'-1 to 11'-n each designate a scan register circuit (n=natural number); 13 designates a flip-flop circuit; 17 designates a multiplexer circuit; I11 designates an inverter circuit; and N21, N22 each designate a node.

Such a conventional semiconductor integrated circuit is typically composed of the logic circuit 5' and scan path circuit 1'. The scan path circuit 1' is constituted by connecting the plurality of scan register circuits 11'-1 to 11'-n in series, each of which has terminals D1, SI, SM, T on the input side and terminals QC and Q on the output side. As shown in FIG. 21, the scan register circuits 11'-1 to 11'-n each have the flip-flop circuit 13, multiplexer circuit 17, and inverter circuit I11.

Here, the flip-flop circuit 13 has a data input terminal d and a clock terminal t on the input side, and a non-inversion data output terminal q and an inversion data output terminal qc on the output side. The circuit 13 takes in data at the data input terminal d in synchronization with a clock signal through the terminal T of one corresponding scan register circuit, and outputs the data from the non-inversion data output terminal q to the logic circuit 5' and further outputs the data from the inversion data output terminal qc to the logic circuit 5' and a scan register circuit at the next stage through the node N21 and terminal Q.

The multiplexer circuit 17 is composed of two OR circuits and one NAND circuit, and selects data at the terminal DI or SI to transfer the data at the terminal d of the flip-flop circuit 13 as a memory circuit. This selection is carried out by a SM signal or shift mode signal through the terminal SM: the terminal SI is selected when the SM signal is "1", while the terminal DI is selected when the SM signal is "0".

Here, the scan path circuit 1' operates as a serial shift resister in which the terminals SIP and SOP are set at the input and output, respectively when the SM signal is "1", while it operates as a register that takes in from the terminal DI and then outputs the data form the terminals Q and QC.

FIG. 22 is a layout schematic of a semiconductor integrated circuit device employing the semiconductor integrated circuit as shown in FIG. 21. In FIG. 22, the reference numeral 21' designates a semiconductor integrated circuit device; a1-an, b1-bn, b11-bn1, and b12-bn2 each designate a wire; and N1-Nn each designate a node, and marks which are the same as the above are identified by the same or corresponding parts and these explanation will be omitted. The wires a1-an connects the terminals QC of the scan register circuits 11'-1 to 11'-n to the logic circuit 5', respectively, while the wires b1-bn are connected to the terminals Q and branch to the wires b11-bn1 and wires b12-bn2 at the node N1-Nn, respectively, and serially connected to the logic circuit 5' and the scan register circuit at the next stage (e.g., in the case of the scan register circuit 11'-1, the next stage is the scan register circuit 11'-2).

As shown in FIGS. 21 and 22, in the semiconductor integrated circuit with a scan path circuit and the device employing this circuit, a test of the electronic system is carried out by a so-called scan test.

The operation of the scan test will be next described.

In a step ST1, the shift mode signal is set to SM="1", and test data are serially shifted in from the terminal SIP to the scan path circuit 1' while a plurality of clock pulses are given to the terminal T of each scan register circuit that is connected to the terminal t of the corresponding flip-flop circuit 13. Subsequently, in a step ST2, it is set to SM="0", and by supplying one clock pulse to the terminal T, test results of the logic circuit 5' to the test data are taken in the scan path circuit 1'. Then, in a step ST3, it is set to SM="1" again, and the test results in the scan path circuit 1' are serially shifted out from the terminal SOP while a plurality of clock pulses are given to the terminal T. Further, in a step ST4, the above steps ST1 to ST3 are repeated. Note that in the step ST3, the operation of the step ST1 also may be simultaneously implemented.

Next, FIG. 23 is a circuit diagram showing one example of a conventional CMOS scan path register circuit, which may be constituted in a CMOS semiconductor circuit device. It should be noted that a connection drawn by a dotted line may be omitted. In FIG. 23, the reference numerals N1–N14, N17, N30, N31 each designate a NMos transistor; and P1–P14, P17, P30, P31 each designate a PMOS transistor. The NMOS transistors N1–N3, N30 and the PMOS transistors P1–P3, P30 constitute a multiplexer circuit 17.

As shown in FIGS. 21 and 23, in many cases, the multiplexer circuit employed in the conventional CMOS scan register circuit is often constituted by employing an OR-NAND compound gate integrated with two OR circuits and one NAND circuit. Here, the compound gate is a function block that is constituted by a combination of a plurality of simple gates such as AND, OR, and inverter. Since this kind of compound gate is commonly optimized when prepared by a vendor, the number of components may be minimized as compared to a case that performs the same function by only simple gates, thereby providing excellent characteristics in consumption power and operating speed.

There is JP-A 06/160479(1994) as a disclosure of a semiconductor integrated circuit prepared with a transfer gate and a latch between an output QC of a flip-flop circuit and a multiplexer circuit at the next stage. In addition, there is JP-A 05/157807(1993) as a memory circuit provided with a transfer gate prepared between an output QC and a multiplexer at the next stage.

Thus, since a scan register circuit is typically provided by a semiconductor or cell library vendor as a simple cell within a cell library in a hierarchy design method, it is common that a flip-flop circuit and a multiplexer circuit in the scan register is fixedly connected with each other.

Since the semiconductor integrated circuit with a scan path circuit and the device using this circuit in the prior art are constituted as, described above, serial wires (Q to SI) for serial shift registers through the nodes N1-Nn are connected to the respective output terminals Q of the scan register circuits 11'-1 to 11'-n constituting the scan path circuit 1'. Since the serial wires become a capacitance element, there arise problems such as delay increase at the output Q and increased consumption power.

SUMMARY OF THE INVENTION

The present invention has been implemented to solve the foregoing problems. It is therefore an object to provide a semiconductor integrated circuit and a device with this circuit which prevent delay of an output Q and reduce consumption electric power.

According to a first aspect of the present invention, there is a provided a semiconductor integrated circuit comprising: a scan path circuit being constituted by serially connecting a plurality of scan register circuits, each of which is constituted by an OR-NAND compound gate circuit, a flip-flop circuit, and an OR circuit; and a logic circuit to be tested by use of the scan path circuit, wherein a first input of OR function in the OR-NAND compound circuit is connected to the logic circuit to be tested, and a second input thereof is controlled by a first shift mode signal, while an input of the NAND function is connected to a serial input terminal, and the output thereof is connected to a data input terminal of the flip-flop circuit, and wherein an output of the flip-flop circuit is connected to a first input of the OR circuit, while a second input thereof is controlled by a second shift mode signal, and an output of the OR circuit is connected to a serial output terminal.

Here, the scan register circuits each may include an inverter circuit which outputs a second shift mode signal independent of the scan register circuit in response to the first shift mode signal.

The scan register circuits each may include an inverter circuit which outputs a first shift mode signal independent of the scan register circuit in response to the second shift mode signal.

According to a second aspect of the present invention, there is provided a semiconductor integrated circuit comprising: a scan path circuit being constituted by serially connecting a plurality of scan register circuits, each of which is constituted by an OR-NAND compound gate circuit, a flip-flop circuit, and a NAND circuit; and a logic circuit to be tested by use of the scan path circuit, wherein a first input of OR function in the OR-NAND compound circuit is connected to the logic circuit to be tested, and a second input thereof is controlled by a first shift mode signal, while an input of the NAND function is connected to a serial input terminal, and the output thereof is connected to a data input terminal of the flip-flop circuit, and wherein an output of the flip-flop circuit is connected to a first input of the NAND circuit, while a second input thereof is controlled by a second shift mode signal, and an output of the NAND circuit is connected to a serial output terminal.

Here, the first shift mode signal may be identical to the second shift mode signal.

The flip-flop circuit may have at least two output terminals which output the same logic data, and any one of these terminals is connected to the first input of the NAND circuit.

According to a third aspect of the present invention, there is provided a semiconductor integrated circuit. comprising: a logic circuit to be tested by a scan test; and a scan path circuit being constituted by serially connecting a plurality of scan register circuits, each of which includes a compound gate circuit having a first logic gate and a second logic gate, a flip-flop circuit connecting an output of said compound gate circuit to a data input terminal, and a gate circuit connecting a first input thereof to a data output terminal of the flip-flop circuit and connecting a second input thereof to a second connection terminal input by a second shift mode signal, and which connects the compound gate circuit, flip-flop circuit, and gate circuit in this turn, wherein a first input of the first logic gate is connected to the logic circuit to be tested, and a second input thereof is connected to a first connection terminal input by a first shift mode signal, while a first input of the second logic gate is connected to an output of the first logic gate and a second input thereof is connected to a serial input terminal.

Here, a second input of the second logic gate in the scan register circuit at a first stage may be connected to an output of another gate circuit connecting its first input to one of shift mode signals.

According to a fourth aspect of the present invention, there is provided a semiconductor integrated circuit device having the above semiconductor integrated circuit, wherein an output terminal of non-inversion or inversion prepared for the flip-flop circuit is electrically connected to first and second wires which output the same logic data, and the first and second wires electrically connect the circuit to be tested and a first input of the gate circuit in the scan register circuit, respectively.

BRIEF DESCRIPTION OF THE DRAWINGS

FIG. 11 is a truth table of operation modes in the circuit of FIG. 10;

DETAILED DESCRIPTION OF THE PREFERRED EMBODIMENTS

The invention will now be described with reference to the accompanying drawings.

EMBODIMENT 1

Figure 1:
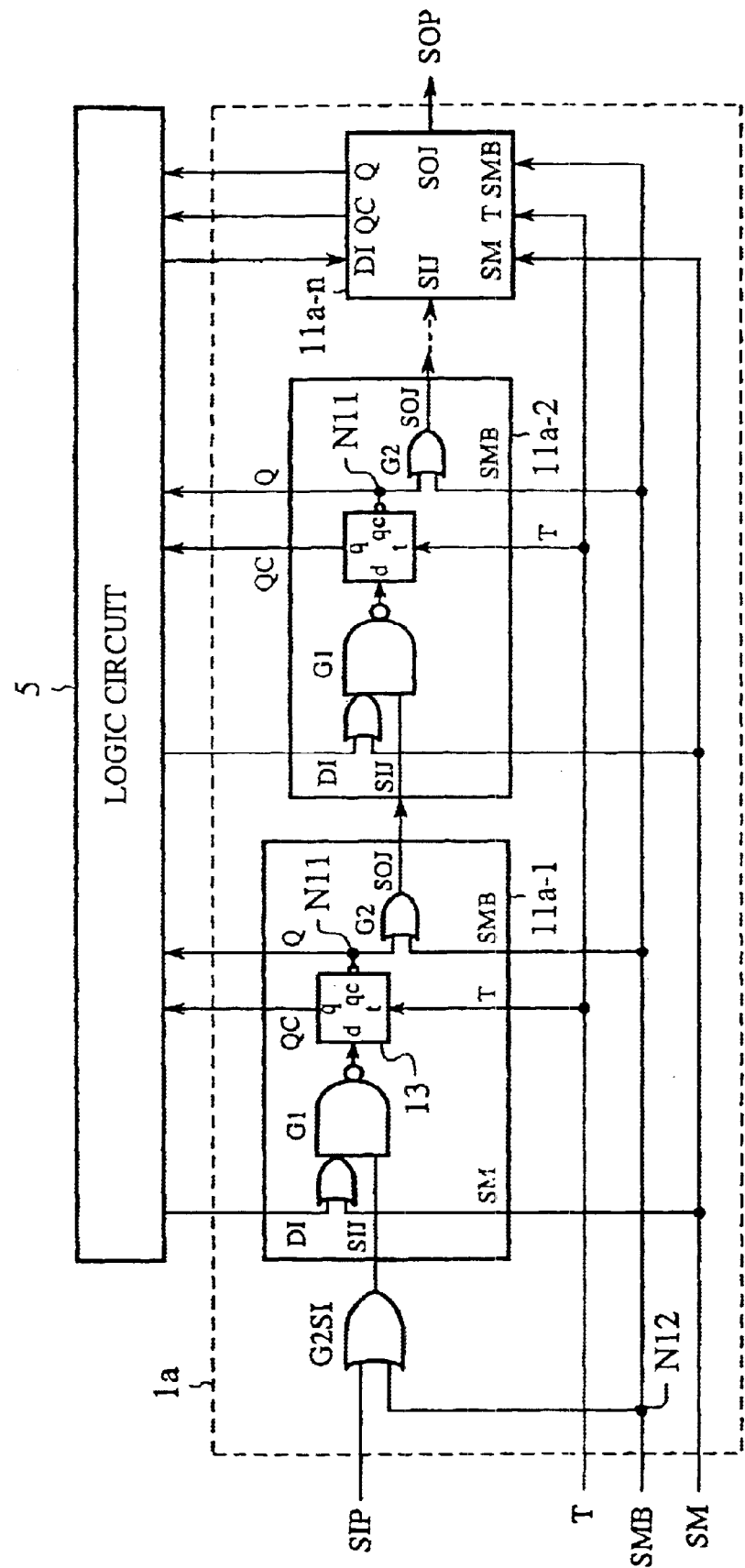
FIG. 1 is a circuit diagram showing a semiconductor integrated circuit with a scan path circuit according to an embodiment 1 of the present invention.

FIG. 1 is a circuit diagram showing a semiconductor integrated circuit with a scan path circuit according to an embodiment 1 of the present invention. In FIG. 1, the reference numeral 1a designates a scan path circuit; 5 designates a logic circuit to be tested; 11a-1 to 11a-n each designate a scan register circuit (n=natural number); 13 designates a flip-flop circuit as a memory circuit; G1 designates a first gate circuit which is an OR-NAND circuit as a compound gate; G2 (or G2SI) is a second gate circuit which is an OR circuit as a simple gate; and N11, N12 each designate a node.

A semiconductor integrated circuit according to the embodiment 1 is composed of a logic circuit 5 and a scan path circuit 1a. The circuit 1a is constituted by connecting a plurality of scan resisters 11a-1 to 11a-n in series, each of which has terminals DI, SIJ, SM, T, SMB on the input side, and terminals QC, Q SOJ on the output side. As shown in FIG. 1, the scan register circuits 11a-1 to 11a-n each have the first gate circuit G1, the flip-flop circuit 13, and the second gate circuit G2.

The flip-flop circuit 13 has a data input terminal d and a clock terminal t on the input side, and a non-inversion data output terminal q and an inversion data output terminal qc on the output side. The circuit 13 takes in data at the data input terminal d in synchronization with a clock signal through the terminal T of a corresponding scan register circuit, and outputs the data from the non-inversion data output terminal q and the inversion data output terminal qc.

As to the first gate circuit G1 disposed at the front stage of the flip-flop circuit 13, the first input of OR function is connected to the logic circuit 5, and the second input thereof is connected to the terminal SM and receives an SM signal as a first shift mode signal, while the input of NAND function is connected to the terminal SIJ as a serial input terminal in addition to the output of OR function, and the output of the first gate circuit G1 is connected to the data input terminal d of the flip-flop circuit 13. In a similar manner, as to the second gate circuit G2 disposed at the rear stage of the first gate circuit G1, the first input of the second gate circuit G2 is connected to the output terminal of the flip-flop circuit 13 or the terminal qc, while the second input thereof is connected to the terminal SMB and receives an SMB signal as a second shift mode signal. Note that a wire from the terminal qc branches to the terminal Q and the second gate circuit G2 through the node N11.

The scan path circuit 1a will be generally described below.

Figure 21:
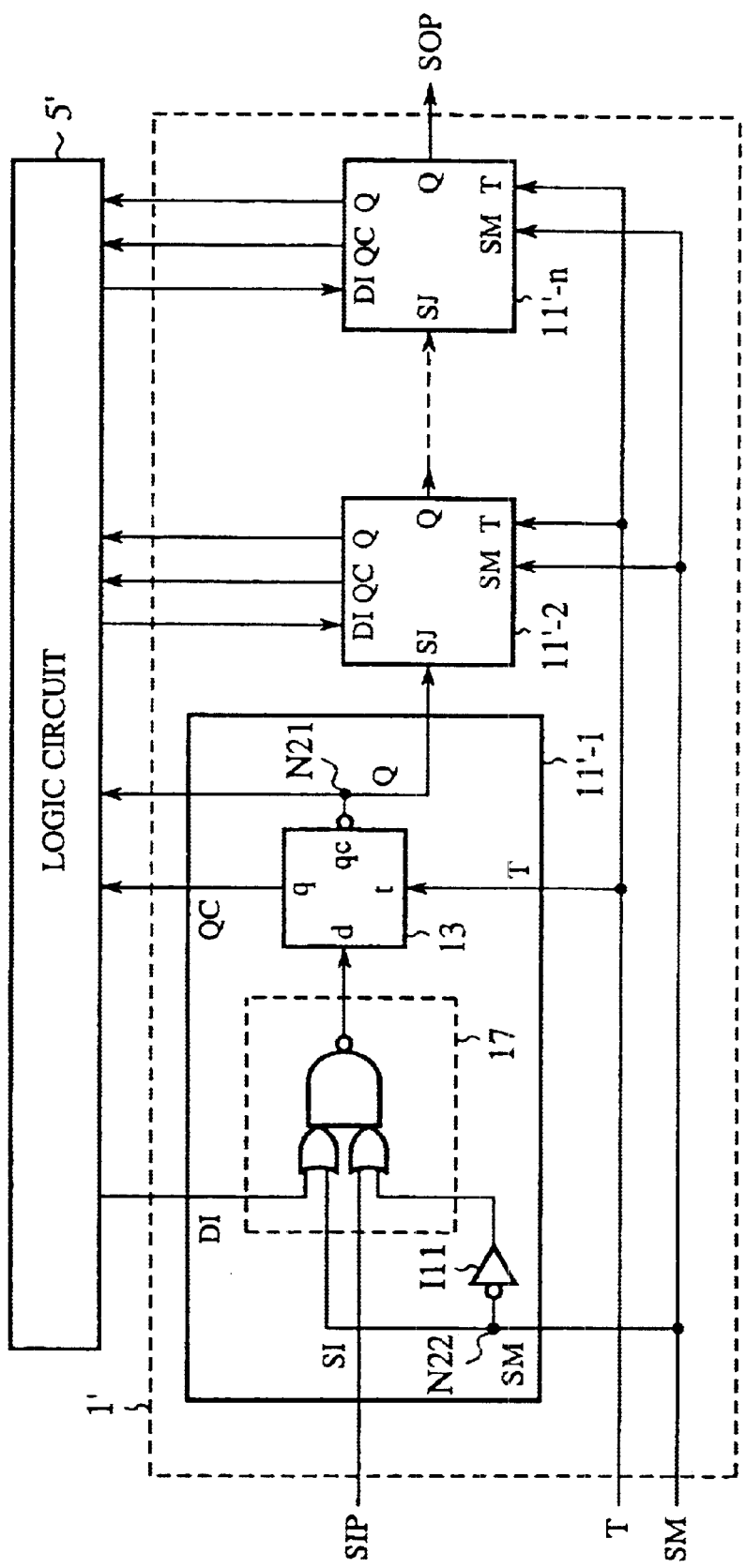
FIG. 21 is a circuit diagram showing a semiconductor integrated circuit with a scan path circuit as one example of a conventional electric system.
Figure 22:
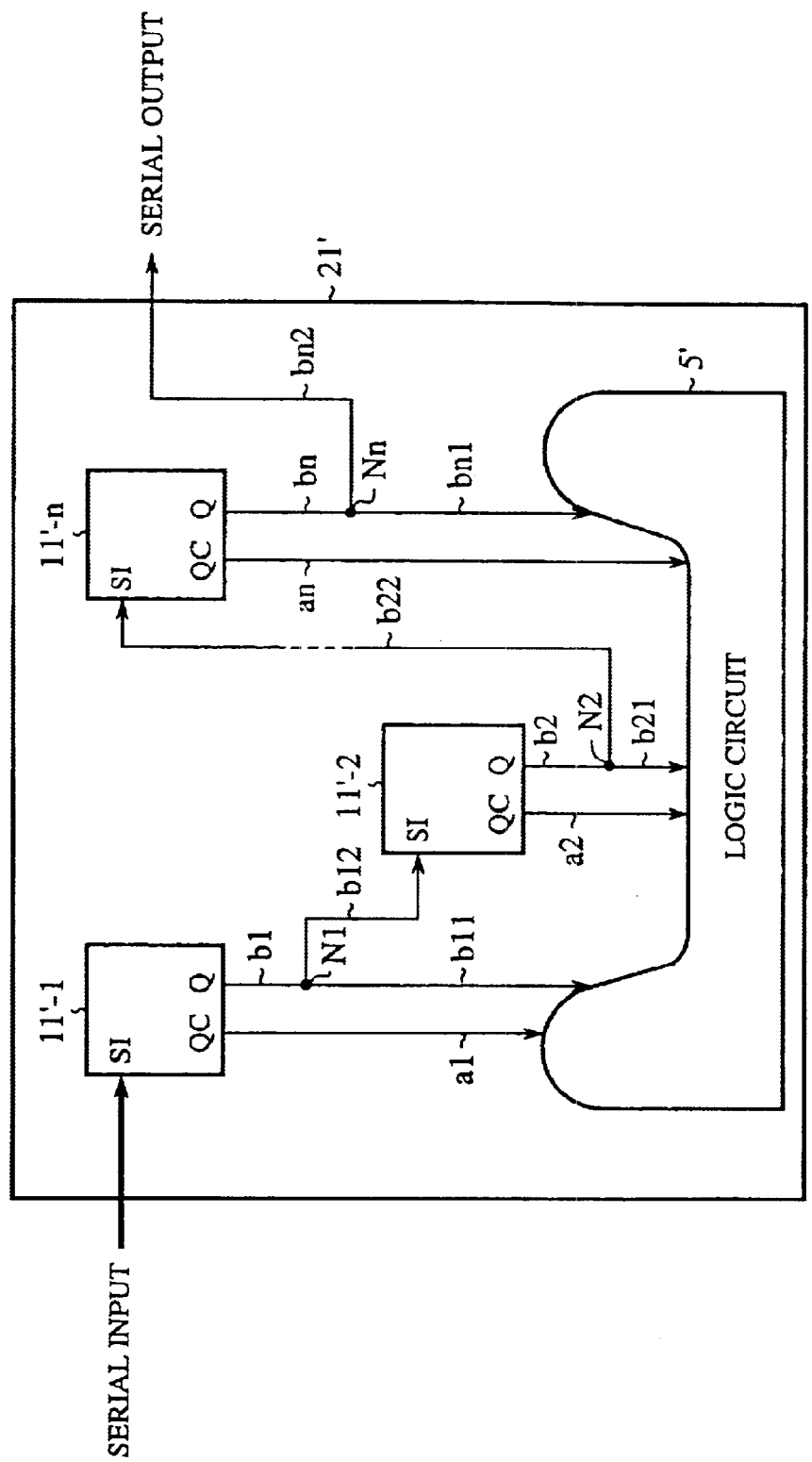
FIG. 22 is a layout schematic of a semiconductor integrated circuit device with a semiconductor integrated circuit device as shown in FIG. 21.
Figure 23:
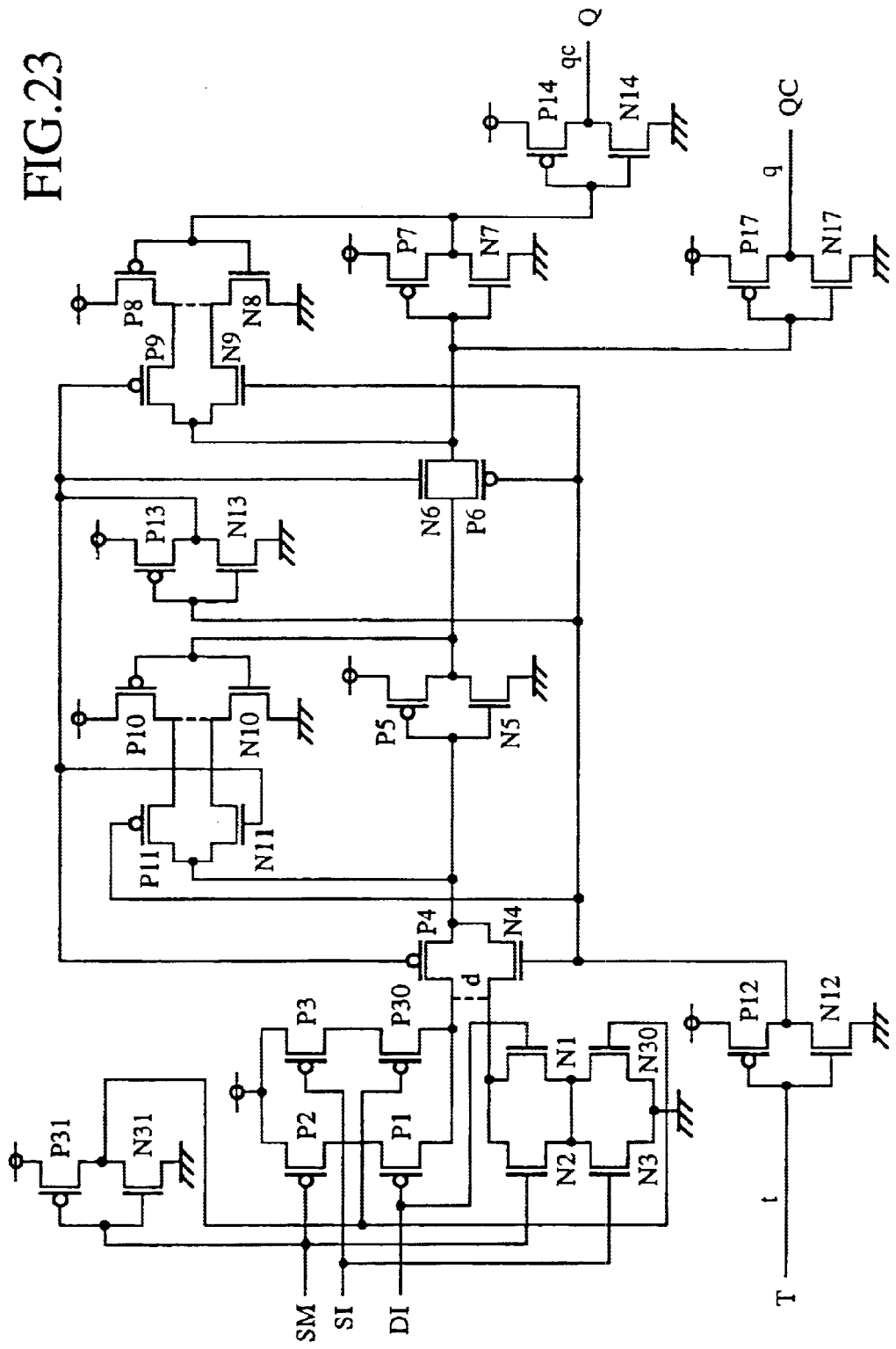
FIG. 23 is a circuit diagram showing one example of a conventional CMOS scan register circuit.

The multiplexer function corresponding to the conventional multiplexer circuit 17 as mentioned in FIG. 21 is assigned to the first gate circuit G1 and the second gate circuit G2 (or G2SI). First, as to the scan register circuit 11a-1 at the first stage, the multiplexer function is constituted by the second gate circuit G2SI and the first gate circuit G1 in the scan register 11a-1. Second, as to the scan register circuit 11a-2 at the second stage, the multiplexer function is constituted by the second gate G2 in the scan register circuit 11a-1 at the front stage and the first gate circuit G1 in the scan register circuit 11a-2.

That is, as to the scan register circuit 11a-n at the n stage (n=2 or more), the multiplexer function is constituted by the second gate circuit G2 in the scan register circuit 11a(n−1) and the first gate circuit G1 in the scan register circuit 11a-n.

The operation of that multiplexer function will be next described.

For example, in the multiplexer function which is constituted by the second gate circuit G2 in the scan register circuit 11a-1 and the first gate circuit G1 in the scan register circuit 11a-2, an SMB signal as a second shift mode signal is controlled by the inversion data of an SM signal in order to implement the same operation as the conventional multiplexer circuit 17. In particular, the function operates as a register such that when the SMB signal to be input at the terminal SMB is "1" and the SM signal to be input at the terminal SM is "0", the data is taken in from the logic circuit 5 through the terminal DI and output from the terminals Q and QC. On the other hand, the function operates as a serial shift register such that when the SMB signal is "0" and the SM signal is "1", the information is serially transferred through the terminals SOJ, SIJ of the second gate circuit G2.

Figure 2:
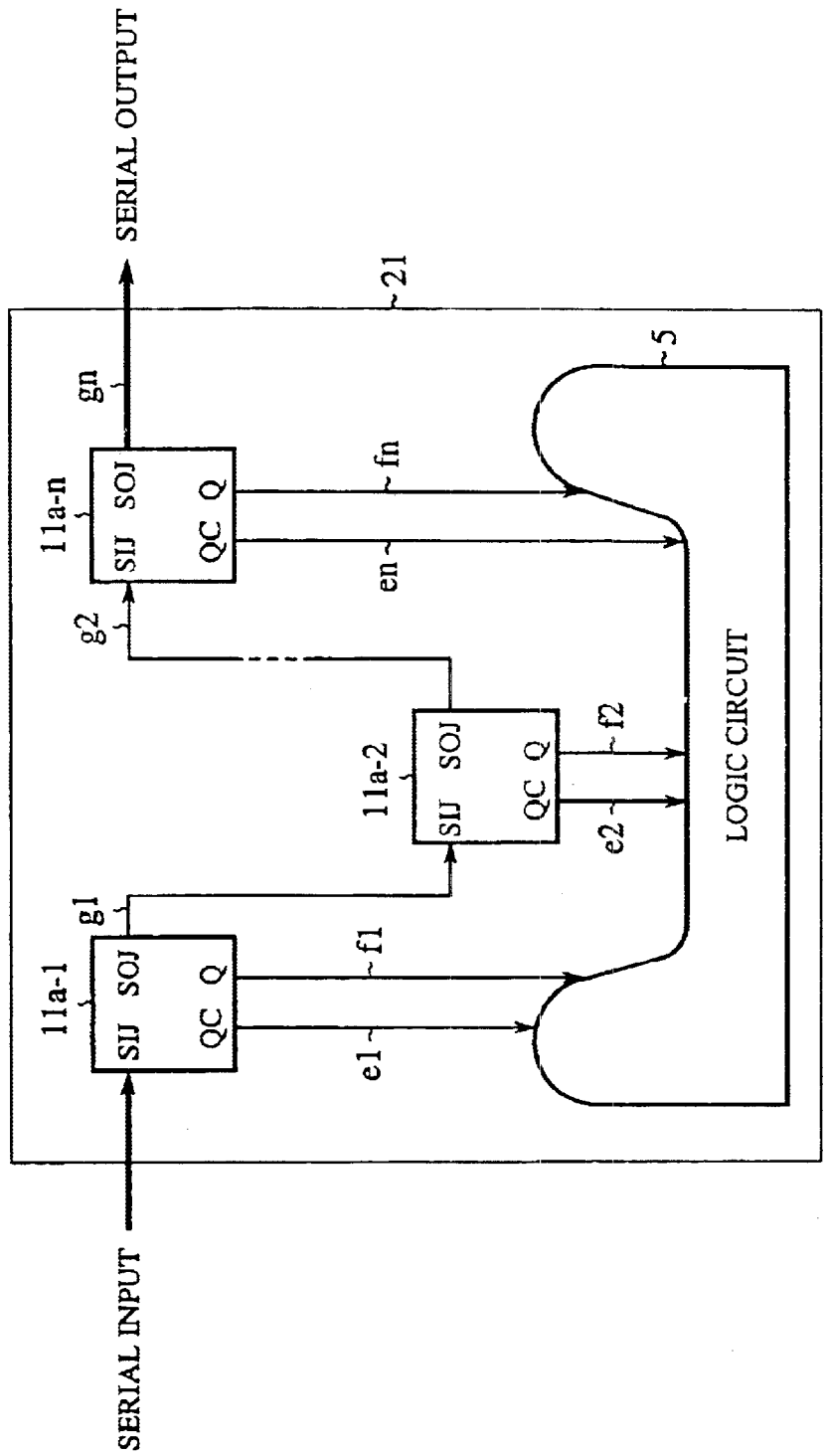
FIG. 2 is a layout schematic of a semiconductor integrated circuit device with the semiconductor integrated circuit of FIG. 1.

Next, FIG. 2 is a layout schematic showing a semiconductor integrated circuit device employing the semiconductor integrated circuit of FIG. 1. In FIG. 2, the reference numeral 21 designates a semiconductor integrated circuit device; e1-en, f1-fn, and g1-gn designate wires; and marks which are the same as the above are identified by the same or corresponding parts and these explanation will be omitted.

The wires e1-en connect the terminals QC of the scan register circuits 11a-1 to 11a-n to the logic circuit 5; the wires f1-fn connects the terminals Q to the logic circuit 5, respectively; the wires g1-gn are serially connected among the scan registers 11a-1 to 11a-n.

As shown in FIGS. 1 and 2, in the semiconductor integrated circuit and the device employing this circuit, a test for the electronic system is implemented by a so-called scan test.

The operation will be next described.

First, at a step ST1, when the shift mode signal is set to SM="1" and the inversion signal is set to SMB="0", test data are serially shifted in from the terminal SIP to the scan path circuit 1a while a plurality of clock pulses are applied to the terminal T of each scan register circuit. Second, at a step ST2, when SM="0" and SMB="1" are set, test results of the logic circuit 5 to the test data takes in the scan path circuit 1a from the terminal DI of each scan register circuit while one clock pulse is applied to the terminal T. At a step ST3, when SM="1" and SMB="0" are set, test results in the scan path circuit 1a are'serially shifted out from the terminal SOP while a plurality of clock pulses are applied to the terminal T. Further, at a step ST4, the above steps ST1 to ST3 are repeated. At the step ST3, the operation of the step ST1 may be also carried out simultaneously.

Since the typical scan register circuits 11a-1 to 11a-n are designed as a cell in a cell library, the second gate circuit G2 may be disposed adjacent to the flip-flop circuit 13. Accordingly, a wire length between the second gate circuit G2 and the flip-flop circuit 13 is very short, which results in a small capacitance. Thus, delay increase of the output Q in the scan register circuits 11a-1 to 11a-n may be controlled at a minimum.

In the normal operation state (SM="0", SMB="1"), a signal from the terminal SOJ as a serial output terminal is fixed (in FIG. 1, fixed to "1"), and thereby electric power consumption due to a wire capacitance in a serial path between adjacent scan register circuits may be prevented.

In the semiconductor integrated circuit as shown in FIG. 1, when SM="1" and SMB="0" are set in the input signal, a synchronous set operation (Q="1", QC="0") may be carried out with a clock pulse.

As described above, according to the embodiment 1, since the second gate circuit G2 may be disposed adjacent to the flip-flop circuit 13 in each of the scan register circuits 11a-1 to 11a-n, a wire length between the second gate circuit G2 and the flip-flop circuit 13 may be extremely short, effecting a small wire capacitance. Therefore, delay increase in the output Q of the scan register circuits 11a-1 to 11a-n may be controlled at a minimum.

In the normal operation state, a signal from the serial output terminal SOJ are fixed, and thereby electric power consumption due to a wire capacitance in a serial path between the scan register circuits may be prevented.

EMBODIMENT 2

Figure 3:
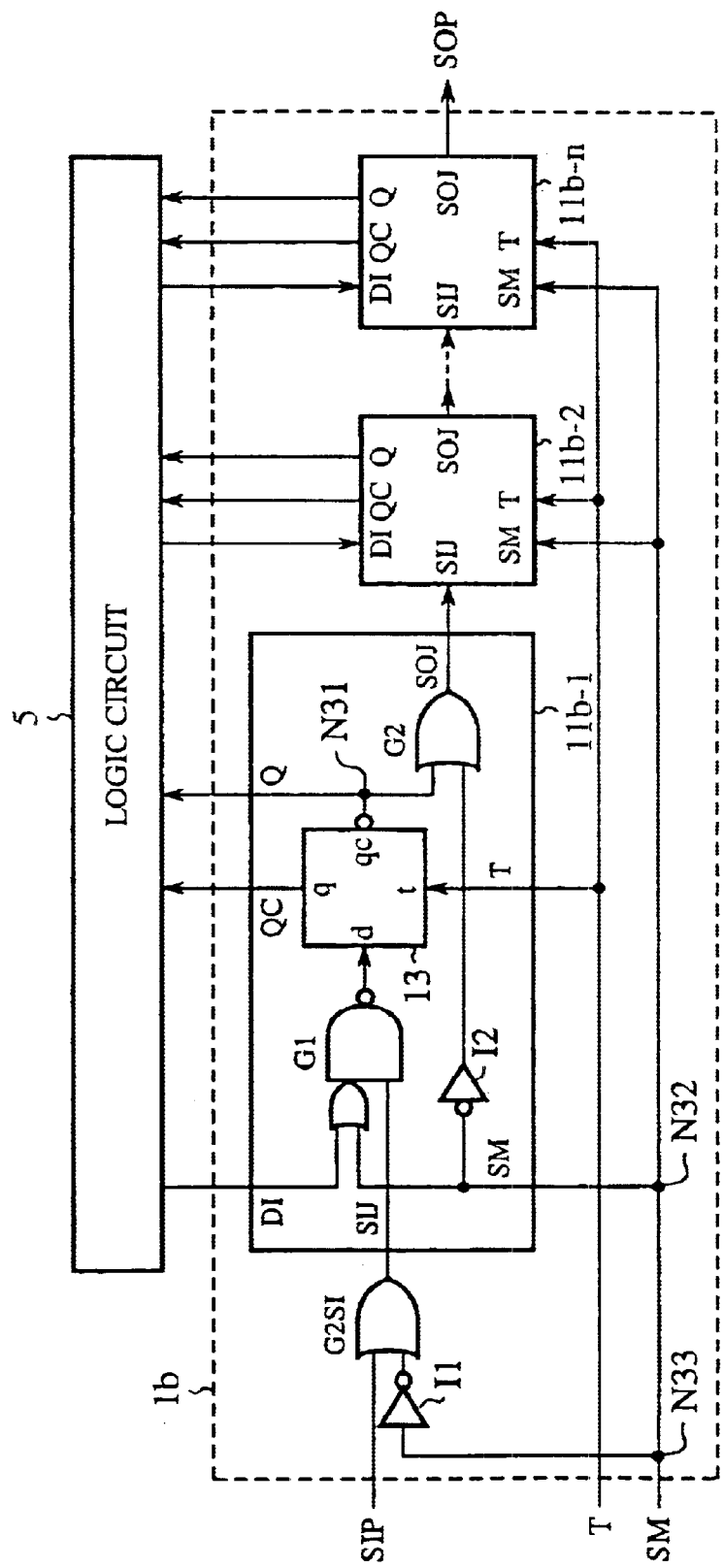
FIG. 3 is a circuit diagram showing a semiconductor integrated circuit with a scan path circuit according to an embodiment 2 of the present invention.

FIG. 3 is a semiconductor integrated circuit with a scan path circuit according to an embodiment 2 of the present invention. In FIG. 3, the reference numeral 1b designates a scan path circuit; 11b-1 to 11b-n each designate a scan register circuit; I1 and I2 each designate an inverter circuit; and N31–N33 each designate a node. Since other components are the same as those of the embodiment 1, the same parts are denoted by the same reference numerals and their explanation will be omitted.

In the circuit of FIG. 3, inverter circuits I1, I2 are added to each of the scan register circuits 11b-1 to 11b-n as compared to the circuit configuration of FIG. 1, and thereby a wire for SMB signals from the terminal SMB is not required and eliminated. That is, the inverter circuit I1 is disposed between the second input of the second gate G2SI and the node N33, while the inverter circuit I2 is disposed between the first gate G2 and the node 32.

The scan path circuit 1b will be generally described below.

A function corresponding to the conventional multiplexer circuit 17 is divided into the first gate circuit G1 and the second gate circuit G2 (or G2SI), and as to the scan register circuit 11b-1 at the first stage, a multiplexer function is constituted by the second gate circuit G2SI and the first gate circuit G1 in the scan register circuit 11b-1.

As to the scan register circuit 11b-n at the nth stage (n=2 or more), the multiplexer function is constituted by the second gate circuit G2 in the scan register circuit 11b-(n−1) and the first gate circuit G1 in the scan register circuit 11b-n.

The operation of the multiplexer function will be next described.

For example, in order to implement the same operation as the conventional multiplexer circuit 17, the multiplexer function constituted by the second gate circuit G2 in the scan register circuit 11b-1 and the first gate circuit G1 in the scan register circuit 11b-2 is performed by inputting to the second gate circuit G2 the SMB signal inverted by the inverter circuit I2. Note that the SM signal is set to "0" at the normal operation, and "1" at the shift operation.

As described above, according to the embodiment 2 as well as the embodiment 1, in addition to controlling for a minimum delay increase at the output Q of each scan register circuit and prevention of electric power consumption due to a wire capacitance in a serial path between the scan register circuits by fixing a signal at the serial output terminal SOJ at the normal operation state, a wire for the SMB signal by adding the inverter circuit I2 to each scan register circuit may be eliminated, thereby reducing a degree of wire congestion in a semiconductor integrated circuit having a wire-congestion issue.

EMBODIMENT 3

Figure 4:
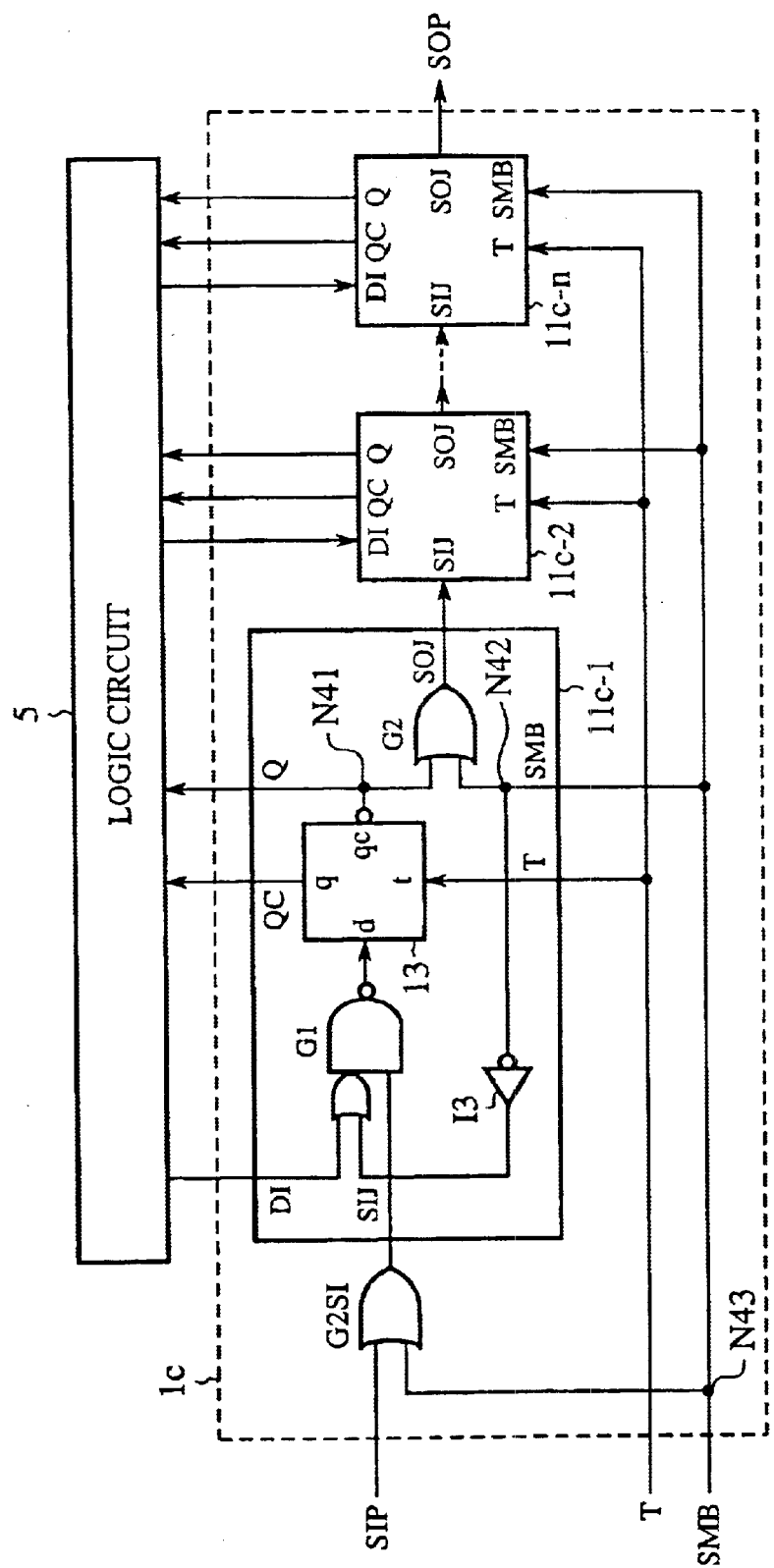
FIG. 4 is a circuit diagram showing a semiconductor integrated circuit with a scan path circuit according to an embodiment 3 of the present invention.

FIG. 4 is a circuit diagram showing a semiconductor integrated circuit with a scan path circuit according to an embodiment 3 of the present invention. In FIG. 4, the reference numeral 1c designates a scan path circuit; 11c-1 to 11c-n each designate a scan register circuit; I3 designates an inverter circuit; and N41–N43 each designate a node. Since other components are the same as those of the embodiment 2, the same parts are denoted by the same reference numerals and their explanation will be omitted.

In the circuit of FIG. 4, as compared to the circuit configuration of FIG. 3, the inverter circuit I1 is eliminated though it is connected to the second input of the second gate circuit G2SI; the inverter circuit I3 is disposed at each of the scan register circuits 11c-1 to 11c-n instead of the inverter circuit I2; and further the terminal SM at the input terminal is excluded, while the terminal SMB is prepared instead. The inverter circuit I3 is disposed between the second input of the OR function at the first gate circuit G1 and the node N42.

In this way, though the circuit configuration of FIG. 4 performs the same function as the circuit of FIG. 3, there is a difference in that an SMB signal is supplied to each scan register instead of an SM signal, and inverted by the inverter circuit I3 to be inputted to the second input of the first gate circuit G1.

The scan path circuit 1c will be generally described below.

A function corresponding to the conventional multiplexer circuit 17 is divided into the first gate circuit G1 and the second gate circuit G2 (or G2SI), and as to the scan register circuit 11c-1 at the first stage, a multiplexer function is constituted by the second gate circuit G2SI and the first gate circuit G1 in the scan register circuit 11c-1. As to the scan register circuit 11c-n at the nth stage (n=2 or more), the multiplexer function is constituted by the second gate circuit G2 in the scan register circuit 11c-(n−1) and the first gate circuit G1 in the scan register circuit 11c-n.

The operation of the multiplexer function will be next described.

For example, in order to implement the same operation as the conventional multiplexer circuit 17, the multiplexer function constituted by the second gate circuit G2 in the scan register circuit 11c-1 and the first gate circuit G1 in the scan register circuit 11c-2 is performed by inputting to the first gate circuit G1 the SMB signal inverted by the inverter circuit I3. Note that the SMB signal is set to "1" at the normal operation, and "0" at the shift operation.

As described above, according to the embodiment 3 as well as the embodiment 2, in addition to controlling for a minimum delay increase at the output Q of each scan register circuit and prevention of electric power consumption due to a wire capacitance in a serial path between the scan register circuits at the normal operation state, a wire for the SM signal by adding the inverter circuit I3 to each scan register circuit may be eliminated, thereby reducing a degree of wire congestion in a semiconductor integrated circuit having a wire-congestion issue.

EMBODIMENT 4

Figure 5:
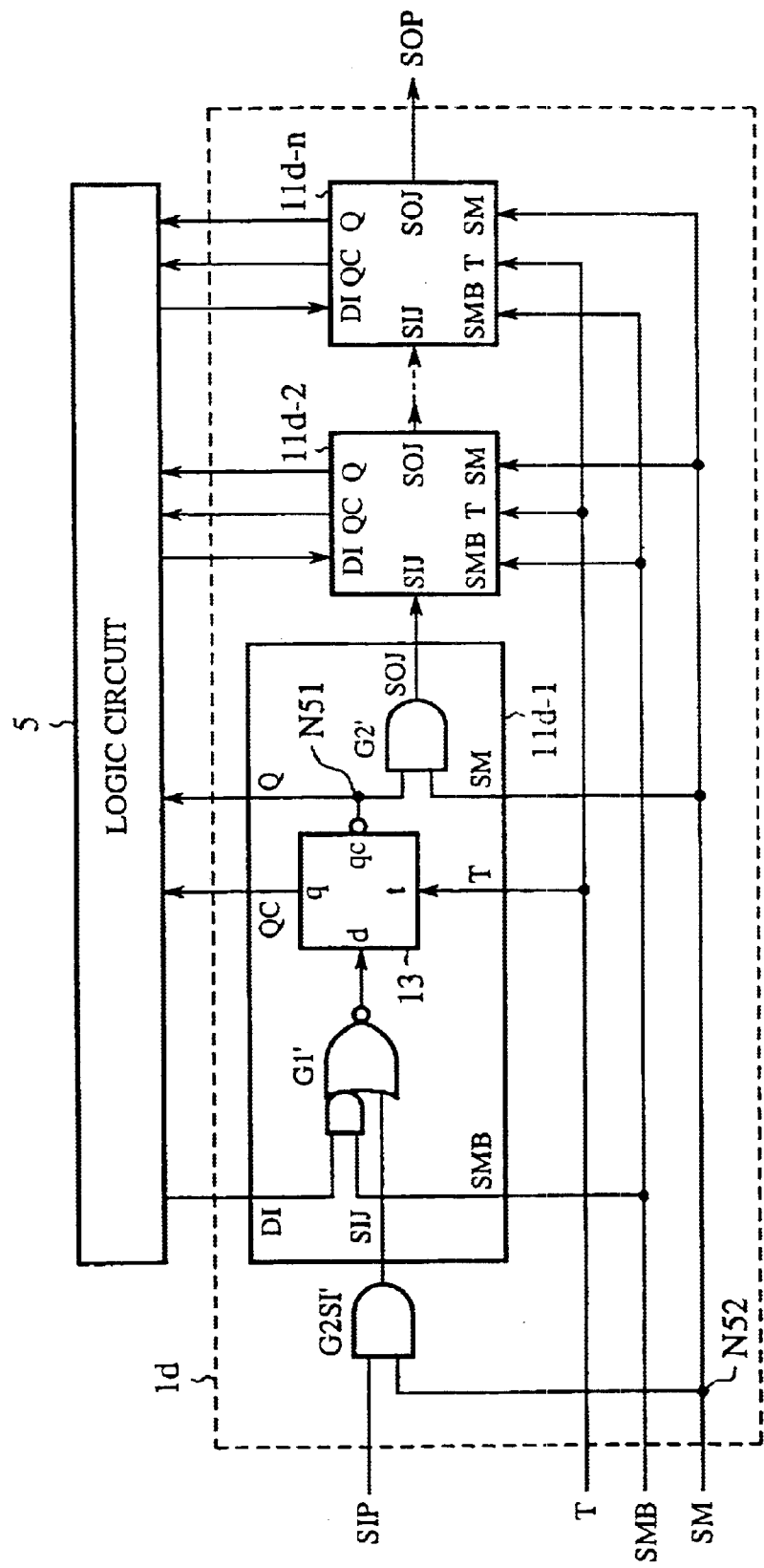
FIG. 5 is a circuit diagram showing a semiconductor integrated circuit with a scan path circuit according to an embodiment 4 of the present invention.

FIG. 5 is a circuit diagram showing a semiconductor integrated circuit with a scan path circuit according to an embodiment 4 of the present invention. In FIG. 5, the reference numeral 1d designates a scan path circuit; 5 designates a logic circuit to be tested; 11d-1 to 11d-n each designate a scan register circuit (n=natural number); 13 designates a flip-flop circuit; G1' designates a first gate circuit which is an AND-NOR circuit as a compound gate; G2' (or G2SI') is a second gate circuit which is an OR circuit as a simple gate; N51, N52 each designate a node.

A semiconductor integrated circuit according to the embodiment 4 is composed of a logic circuit 5 and a scan path circuit 1d. The scan path circuit 1d is constituted by connecting in series a plurality of scan resister circuits 11d-1 to 11d-n, each of which has terminals DI, SIJ, SMB, T, SM on the input side, and terminals QC, Q, SOJ on the output side. As shown in FIG. 5, the scan register circuits 11d-1 to 11d-n each have the first gate circuit G1', the flip-flop circuit 13, and the second gate circuit G2'.

As to the flip-flop circuit 13, it is the same as that in the embodiment 1, and the explanation will be omitted.

As to the first gate circuit G1' disposed at the front stage of the flip-flop circuit 13, the first input of AND function is connected to the logic circuit 5, and the second input thereof is connected to the terminal SMB, while the input of NOR function is connected to the terminal SIJ as a serial input terminal in addition to the output of AND function, and the output of the first gate circuit G1', is connected to the data input terminal d of the flip-flop circuit 13.

In a similar manner, as to the second gate circuit G2' disposed at the rear stage of the first gate circuit G1', the first input of the second gate circuit G2' is connected to the output terminal of the flip-flop circuit 13 or the terminal qc, while the second input thereof is connected to the terminal SM. Note that a wire from the terminal qc branches to the logic circuit 5 and the second gate circuit G2' through the node N51.

The scan path circuit id will be generally described below.

The multiplexer function corresponding to the conventional multiplexer circuit 17 as mentioned in FIG. 21 is assigned to the first gate circuit G1' and the second gate circuit G2' (or G2SI'). First, as to the scan register circuit 11d-1 at the first stage, the multiplexer function is constituted by the second gate circuit G2SI' and the first gate circuit G1' in the scan register 11d-1. Second, as to the scan register circuit 11d-2 at the second stage, the multiplexer function is constituted by the second gate G2' in the scan register circuit 11d-1 at the front stage and the first gate circuit G1' in the scan register circuit 11d-2.

That is, as to the scan register circuit 11d-n at the n stage (n=2 or more), the multiplexer function is constituted by the second gate circuit G2' in the scan register circuit 11a-(n−1) and the first gate circuit G1' in the scan register circuit 11dn.

The operation of that multiplexer function will be next described.

For example, in the multiplexer function which is constituted by the second gate circuit G2' in the scan register circuit 11d-1 and the first gate circuit G1' in the scan register circuit 11d-2, an SMB signal is controlled by the inversion data of an SM signal in order to implement the same operation as the conventional multiplexer circuit 17. In particular, the function operates as a register such that when the SMB signal to be input at the terminal SMB is "1" and the SM signal to be input at the terminal SM is "0", the data is taken in from the logic circuit 5 through the terminal DI and output the resultant from the terminals Q and QC. On the other hand, the function operates as a serial shift register such that when the SMB signal is "0" and the SM signal is "1", the information is serially a transferred through the terminals SOJ, SIJ of the second gate circuit G2'.

Here, the aforementioned layout schematic of the semiconductor integrated circuit device of FIG. 2 may also correspond to that shown in FIG. 5. The semiconductor integrated circuit with a scan path circuit as shown in FIG. 5 carries out the test of electric systems by a scan test as well. The operation detail is the same as that as described in the above embodiment 1, and will be omitted.

Since the typical scan register circuits 11d-1 to 11d-n are designed as a cell in a cell library, the second gate circuit G2' may be disposed adjacent to the flip-flop circuit 13. Accordingly, a wire length between the second gate circuit G2' and the flip-flop circuit 13 is very short, which results in a small capacitance. Thus, delay increase of the output Q in the scan register circuits 11d-1 to 11d-n may be controlled at a minimum.

In the normal operation state (SM="0", SMB="1"), a signal from the terminal SOJ as a serial output terminal is fixed (in FIG. 5, fixed to "1"), and thereby electric power consumption due to a wire capacitance in a serial path between adjacent scan register circuits may be prevented.

In the semiconductor integrated circuit shown in FIG. 5, when SM="0" and SMB="0" are set in the input signal, a reset operation (Q="0", QC="1") may be carried out with a clock pulse.

As described above, according to the embodiment 4, since each of the scan register circuits 11d-1 to 11d-n are disposed adjacent to the second gate circuit G2' and the flip-flop circuit 13, a wire length between the second gate circuit G2' and the flip-flop circuit 13 may be extremely short, effecting a small wire capacitance. Therefore, delay increase in the output Q of the scan register circuits 11d-1 to 11d-n may be controlled at a minimum.

In the normal operation state, a signal from the serial output terminal SOJ are fixed, and thereby electric power consumption due to a wire capacitance in a serial path between the scan register circuits may be prevented.

EMBODIMENT 5

Figure 6:
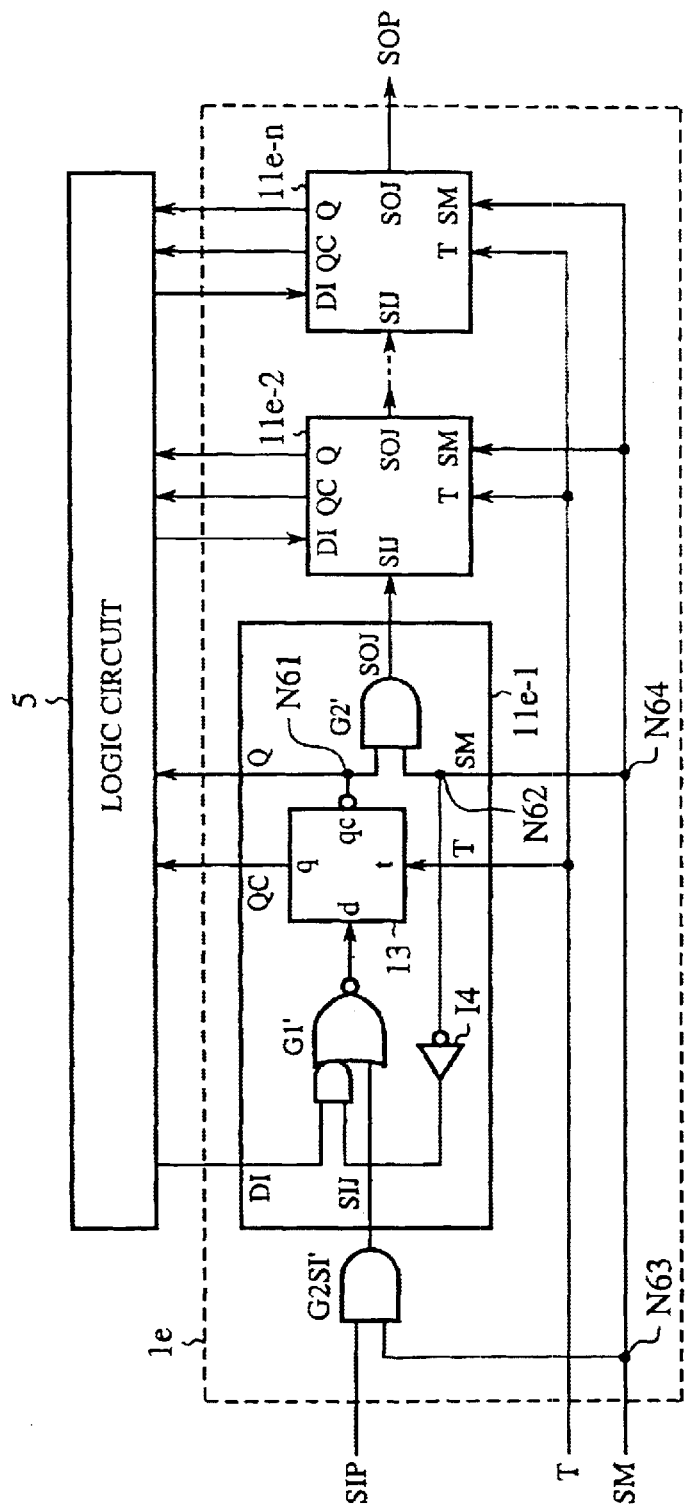
FIG. 6 is a circuit diagram showing a semiconductor integrated circuit with a scan path circuit according to an embodiment 5 of the present invention.

FIG. 6 is a semiconductor integrated circuit with a scan path circuit according to an embodiment 5 of the present invention. In FIG. 6, the reference numeral 1e designates a scan path circuit; 11e-1 to 11e-n each designate a scan register circuit; I4 designates an inverter circuit; and N61–N64 each designate a node. Since other components are the same as those of the embodiment 4, the same parts are denoted by the same reference numerals and their explanation will be omitted.

In the circuit of FIG. 6, inverter circuits I1, I2 are added to each of the scan register circuits 11e-1 to 11e-n as compared to the circuit configuration of FIG. 5, and thereby a wire for SMB signals from the terminal SMB are not required and eliminated. That is, the inverter circuit I4 is disposed between the second input of AND function of the first gate circuit G1' and the node N62.

The scan path circuit 1e will be generally described below.

A function corresponding to the conventional multiplexer circuit 17 is divided into the first gate circuit G1' and the second gate circuit G2' (or G2SI'), and as to the scan register circuit 11e-1 at the first stage, a multiplexer function is constituted by the second gate circuit G2SI' and the first gate circuit G1' in the scan register circuit 11e-1.

As to the scan register circuit 11e-n at the nth stage (n=2 or more), the multiplexer function is constituted by the second gate circuit G2' in the scan register circuit 11e-(n−1) and the first gate circuit G1' in the scan register circuit 11e-n.

The operation of the multiplexer function will be next described.

For example, in order to implement the same operation as the conventional multiplexer circuit 17, the multiplexer function constituted by the second gate circuit G2' in the scan register circuit 11e-1 and the first gate circuit G1' in the scan register circuit 11e-2 is performed by inputting to the first gate circuit G1' the SM signal inverted by the inverter circuit I4. Note that the SM signal is set to "0" at the normal operation, and "1" at the shift operation.

As described above, according to the embodiment 5 as well as the embodiment 4, in addition to controlling for a minimum delay increase at the output Q of each scan register circuit and prevention of electric power consumption due to a wire capacitance in a serial path between the scan register circuits by fixing a signal at the serial output terminal SOJ at the normal operation state, a wire for the SMB signal by adding the inverter circuit I4 to each scan register circuit may be eliminated, thereby reducing a degree of wire congestion in a semiconductor integrated circuit having a wire-congestion issue.

EMBODIMENT 6

Figure 7:
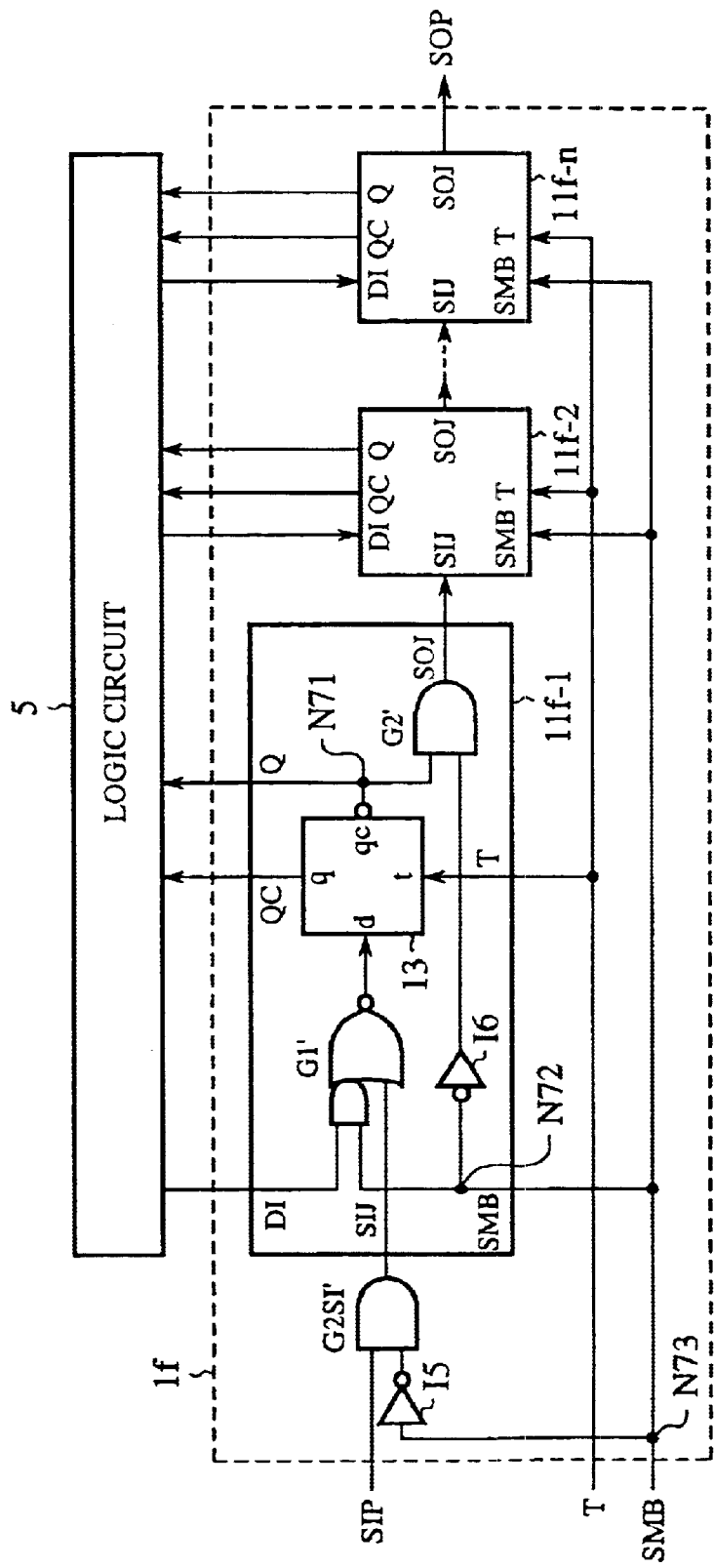
FIG. 7 is a circuit diagram showing a semiconductor integrated circuit with a scan path circuit according to an embodiment 6 of the present invention.

FIG. 7 is a circuit diagram showing a semiconductor integrated circuit with a scan path circuit according to an embodiment 6 of the present invention. In FIG. 7, the reference numeral if designates a scan path circuit; 11f-1 to 11f-n each designate a scan register circuit; I5, I6 each designate an inverter circuit; and N71–N73 each designate a node. Since other components are the same as those of the embodiment 5, the same parts are denoted by the same reference numerals and their explanation will be omitted.

As compared to the circuit configuration of FIG. 6, the circuit of FIG. 7 is added with the inverter circuit I5 which connects the second input of the second gate circuit G2SI' to the terminal SMB, and the inverter circuit I6 is disposed to each of the scan register circuits 11f-1 to 11f-n instead of the inverter circuit I4; and further the terminal SM at the input terminal is excluded, while the terminal SMB is prepared instead. The inverter circuit I6 is disposed between the second input of the AND function at the second gate circuit G2' and the node N72.

In this way, though the circuit configuration of FIG. 7 performs the same function as the circuit of FIG. 6, there is a difference in that an SMB signal is supplied to each scan register circuit instead of an SM signal, and inverted by the inverter circuit I6 to be inputted to the second gate circuit G2'.

The scan path circuit 1f will be generally described below.

A function corresponding to the conventional multiplexer circuit 17 is divided into the first gate circuit G1' and the second gate circuit G2' (or G2SI'), and as to the scan register circuit 11f-1 at the first stage, a multiplexer function is constituted by the second gate circuit G2SI' and the first gate circuit G1' in the scan register circuit 11f-1. Particularly, as to the scan register circuit 11f-n at the nth stage (n=2 or more), the multiplexer function is constituted by the second gate circuit G2' in the scan register circuit 11f-(n−1) and the first gate circuit G1' in the scan register circuit 11f-n.

The operation of the multiplexer function will be next described.

For example, in order to implement the same operation as the conventional multiplexer circuit 17, the multiplexer function constituted by the second gate circuit G2' in the scan register circuit 11f-1 and the first gate circuit G1' in the scan register circuit 11f-2 is performed by inputting to the second gate circuit G2' the SMB signal inverted by the inverter circuit I6. Note that the SMB signal is set to "1" at the normal operation, and "0" at the shift operation.

As described above, according to the embodiment 6 as well as the embodiment 5, in addition to controlling for a minimum delay increase at the output Q of each scan register circuit and prevention of electric power consumption due to a wire capacitance in a serial path between the scan register circuits at the normal operation state, a wire for the SM signal by arranging the inverter circuit I6 to each scan register circuit may be eliminated, thereby reducing a degree of wire congestion in a semiconductor integrated circuit having a wire-congestion issue.

EMBODIMENT 7

Figure 8:
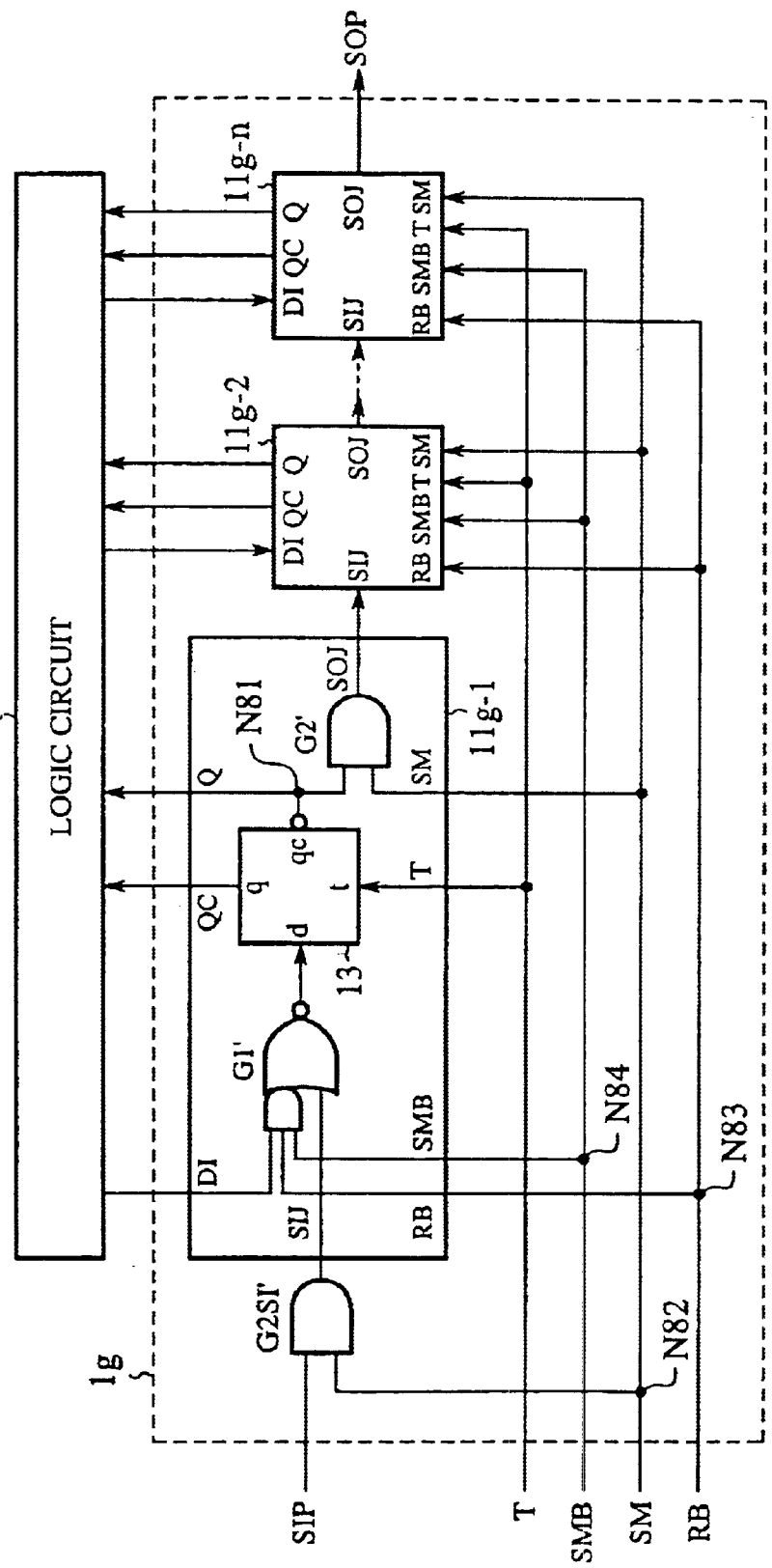
FIG. 8 is a circuit diagram showing a semiconductor integrated circuit with a scan path circuit according to an embodiment 7 of the present invention.

FIG. 8 is a circuit diagram showing a semiconductor integrated circuit with a scan path circuit according to an embodiment 7 of the present invention. In FIG. 8, the reference numeral 1g designates a scan path circuit; 11g-1 to 11g-n each designate a scan register circuit; and N81–84 each designate a node. Since other components are the same as those of the embodiment 4, the same parts are denoted by the same reference numerals and their explanation will be omitted.

A difference with the embodiment 4 is in that the AND part of the gate circuit G1' is changed to 3-input type, and supplied with a reset signal RB. Namely, the reset signal RB is inputted through a terminal RB newly added and supplied to the third input of the AND function of the first gate circuit G' through the node N83. Thus, even at the normal operation (SM="0", SM="1"), when RB="0" is set, the reset operation (Q="0", QC="1") may be carried out with a clock pulse. Note that operation descriptions of the multiplexer function and the scan test will be omitted as similarly to those of the embodiment 4.

As described above, according to the embodiment 7, in addition to controlling for a minimum delay increase at the output Q of each scan register circuit and prevention of electric power consumption due to a wire capacitance in a serial path between the scan register circuits by fixing a signal at the serial output terminal SOJ at the normal operation state as in the embodiment 4, the reset operation may be implemented at the normal operation.

EMBODIMENT 8

Figure 9:
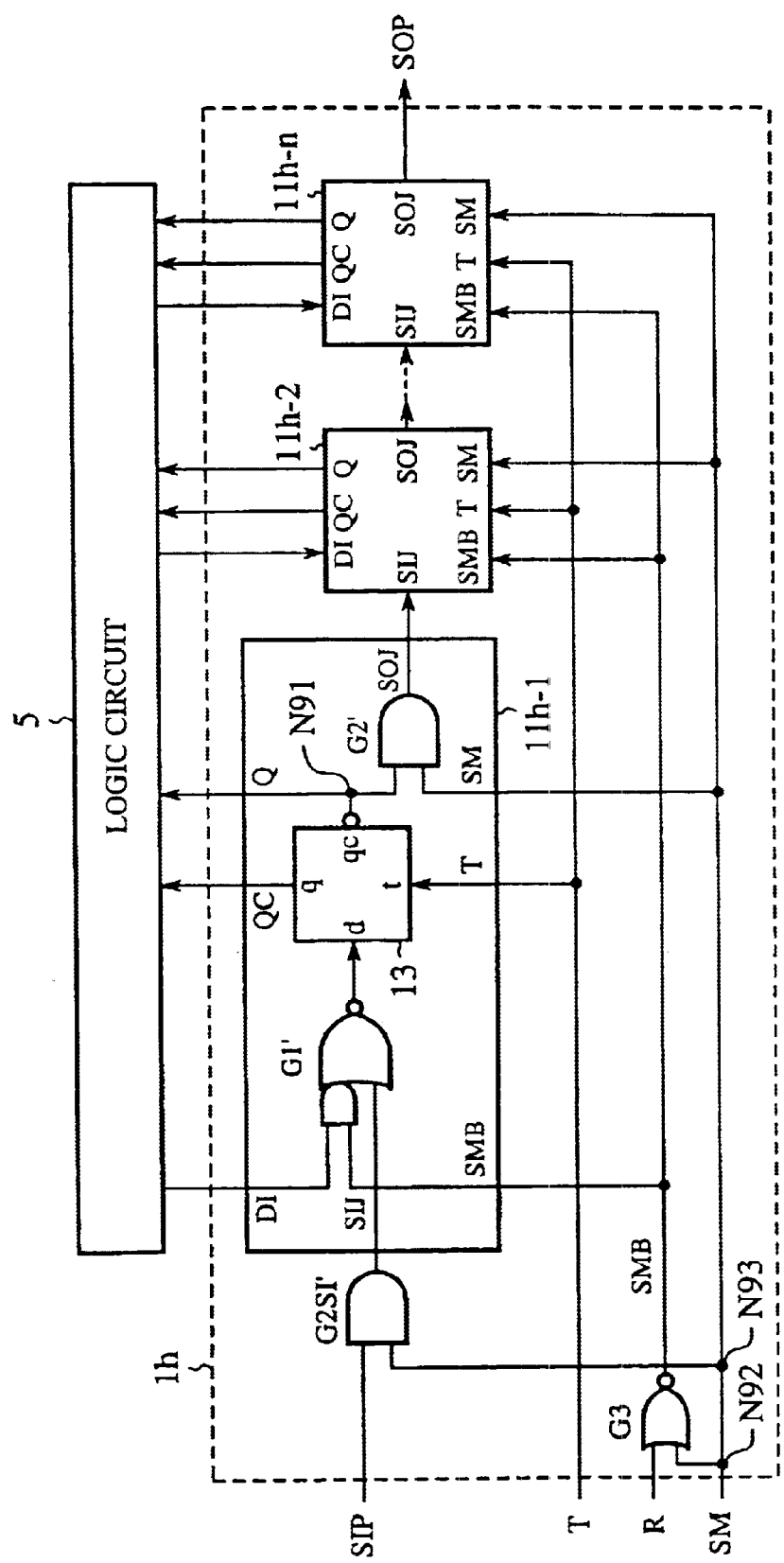
FIG. 9 is a circuit diagram showing a semiconductor integrated circuit with a scan path circuit according to an embodiment 8 of the present invention.

FIG. 9 is a circuit diagram showing a semiconductor integrated circuit with a scan path circuit according to an embodiment 8 of the present invention. In FIG. 9, the reference numeral 1h designates a scan path circuit; 11h-1 to 11h-n each designate a scan register circuit; G3 designates a third gate circuit consisting of NOR circuit; and N91–93 each designate a node. Since other components are the same as those of the embodiment 4, the same parts are denoted by the same reference numerals and their explanation will be omitted.

The first input of the third gate circuit G3 is connected to the terminal R inputted by a reset signal R, and the second input thereof is connected to the terminal SM through the node N92.

Thus, when the SM signal is set to "0" at the normal operation and "1" at the shift operation, the same operation as those of the embodiment 4 may be implemented. In addition, when the R signal as a reset signal is set to "0", the SMB signal becomes an inverted signal of the SM signal, while when the R signal is set to "1", the SMB signal is fixed to "0", and thereby the reset operation may be carried out at the normal operation (SM="0"). Note that operation descriptions of the multiplexer function and the scan test will be omitted as similarly to those of the embodiment 4.

The circuit configuration of FIG. 9 just disposes the gate circuit G3 at the front stage of the scan register circuits 11h-1 to 11h-n, and does not require a wire from the terminal RB as shown in FIG. 8. Therefore, when the scan path circuit is constituted by a large number of scan register circuits, the complete circuit scale can be made smaller than the circuit configuration of FIG. 8 in the embodiment 7.

As described above, according to the embodiment 8, since the third gate circuit G3 as a NOR circuit is disposed at the front stage of a set of scan register circuits 11h-1 to 11h-n, a circuit scale may be reduced when a scan path circuit is constituted by a large number of scan register circuits, in addition to the aforementioned effect of the embodiment 4.

EMBODIMENT 9

Figure 10:
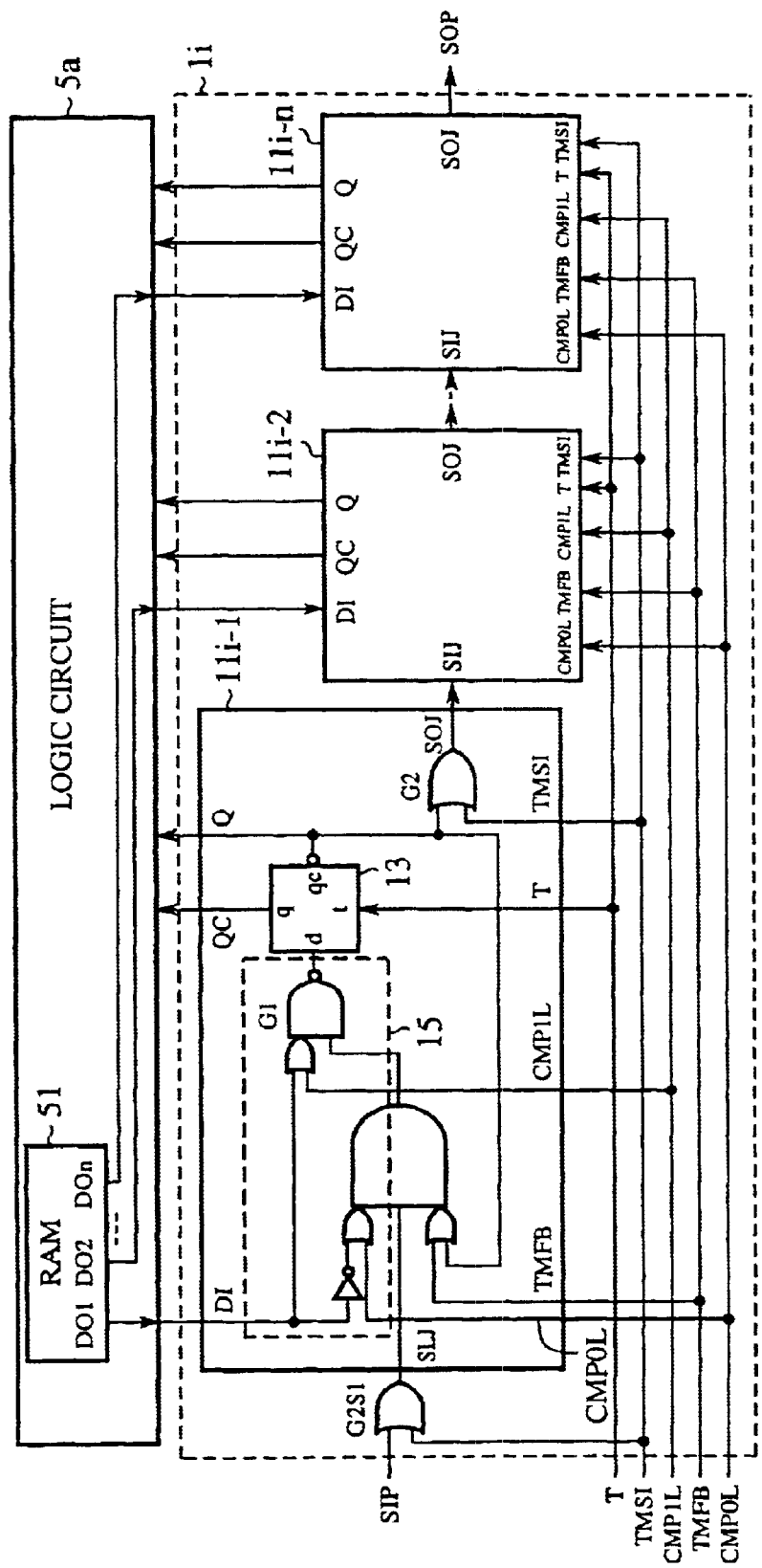
FIG. 10 is a circuit diagram showing a semiconductor integrated circuit with a scan path circuit according to an embodiment 9 of the present invention.

FIG. 10 is a circuit diagram showing a semiconductor integrated circuit with a scan path circuit according to an embodiment 9 of the present invention, and FIG. 11 is a truth table of the circuit of FIG. 10. In FIGS. 10 and 11, the reference numeral 1i designates a scan path circuit; 5a designates a logic circuit to be tested; 11i-1 to 11i-n each designate a scan register circuit (n=natural number); 15 designates a comparator; and 51 designates a RAM incorporated by the logic circuit 5a. Other components which are the same as above the same parts are denoted by the same reference numerals, and their explanation will be omitted.

The input side of the above circuit has terminals TMSI, CMP1L, TMFB, and CMPOL in addition to terminals SIP and T. The terminals TMSI, CMP1L, TMFB, and CMPOL are inputted by TMSI, CMP1L, TMFB, and CMPOL signals, respectively, and the terminals SIP and T are inputted by an SIP signal as a serial signal and a T signal as a clock signal, respectively.

In the circuit of FIG. 10, a comparison function is added to each scan register circuit as compared to the circuit of FIG. 1 in the above embodiment 1, and enables to compare output data of the RAM 51, i.e. DO1, DO2, ..., Don, with an expected value. The same effect as that of the semiconductor integrated circuit in the aforementioned embodiment 1 is provided even for that scan path circuit with that comparison function.

The operation will be next described based on the truth table in FIG. 11.

(1) In the normal mode (capture), when only the CMP1L signal is set to "0", the output data of the RAM 51 from the terminal DI is taken in.

(2) In the hold mode, when only the TMFB signal is set to "0", the data loop is constructed and hold the data of the scan register circuit.

(3) In the shift mode, when only the TMSI signal is set to "0", the serial shift operation of the scan path circuit is performed.

(4) In the RAM test mode, the comparison operation is performed in accordance with the truth table. The symbol "exp" is an expected value ("0" or "1"). The "exp" itself is supplied to the terminal CMPOL, while an inversion value of the "exp" is supplied to the terminal CMP1L.

When one value (e.g., "1") differing from the expected value "exp" (e.g., "0") is output from the RAM, the output of the first gate circuit G1 becomes "1". When a clock pulse is fed to the signal T, the scan register circuit is reset (Q="0", QC="1").

When the same value (e.g., "0") as the expected value (e.g.,"0") is output from the RAM, the data of the scan register circuit is sustained since a loop of the data is completed.

Note that the scan register has to be set to "1" (Q="1", Q="0") prior to the comparison operation.

(5) In the set 1 mode, while all the TMSI, TMFB, CMPO1L, and CMP1L signals are set to "1", the scan register circuit is reset by feeding a clock pulse to the signal T (Q="1", QC="0").

As described above, according to the embodiment 9, since the scan path circuit 1i is constituted by the logic circuit 5a with the RAM 51 which has a comparison function, there is provided a circuit configuration with a comparison function in addition to the same effect as that of the embodiment 1 above.

EMBODIMENT 10

Figure 12:
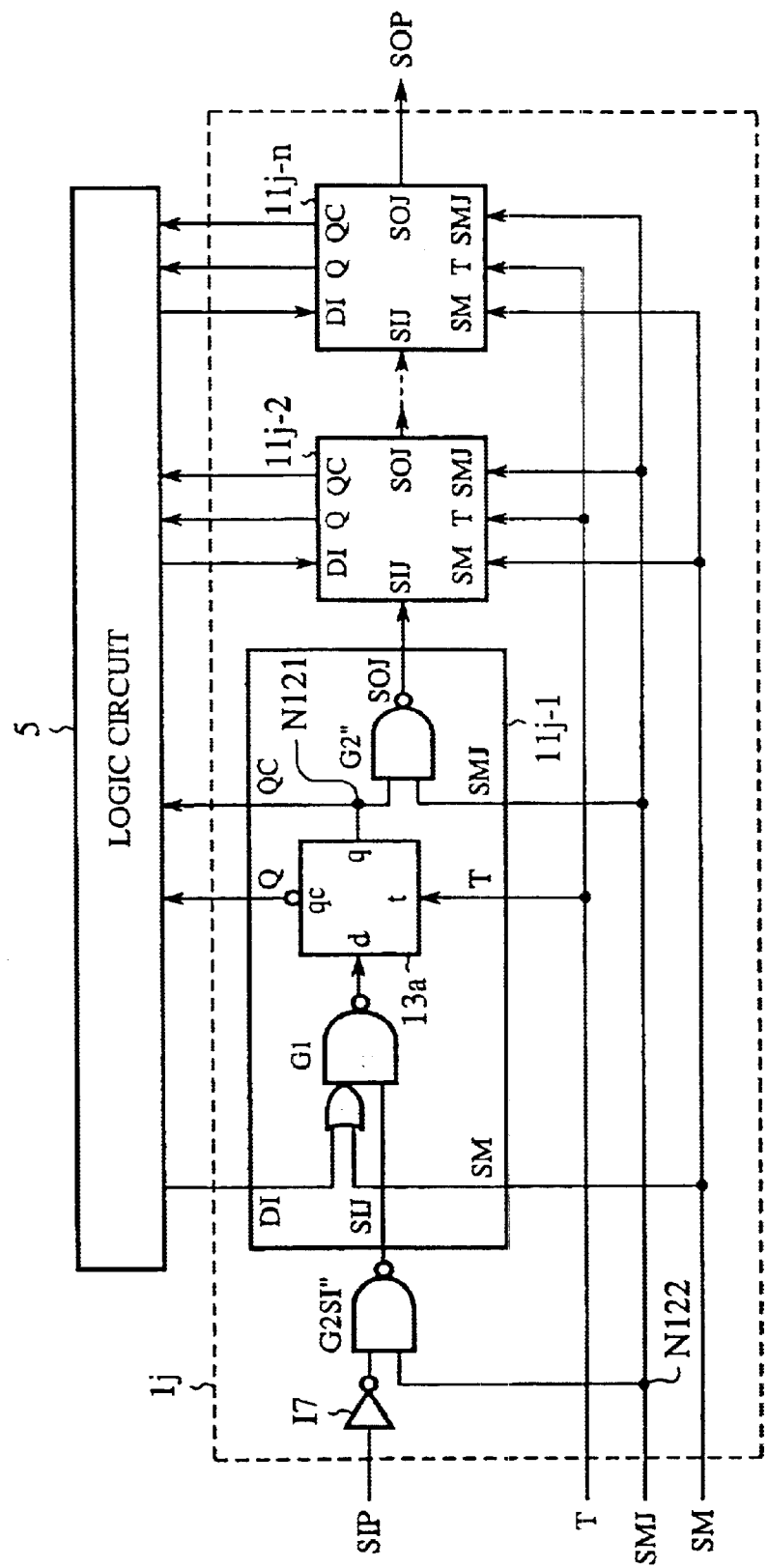
FIG. 12 is a circuit diagram showing a semiconductor integrated circuit with a scan path circuit according to an embodiment 10 of the present invention.

FIG. 12 is a circuit diagram showing a semiconductor integrated circuit with a scan path circuit according to an embodiment 10 of the present invention. In FIG. 12, the reference numeral 1j designates a scan path circuit; 11j-1 to 11j-n each designate a scan register circuit; G2" (or G2SI") designates a second gate circuit; 13a designates a flip-flop circuit as a memory circuit; I7 designates an inverter circuit; and N121–N122 each designate a node. Since other components are the same as those of the embodiment 1, the same parts are denoted by the same reference numerals and their explanation will be omitted.

This is a difference with the circuit architecture of FIG. 1 according to the embodiment 1 in that, for example, in the scan register circuit 11j-1, the second gate circuit G2" is replaced from an OR circuit to a NAND circuit; and that one input of the second gate circuit G2" is connected to the terminal q of the flip-flop circuit 13a through the node N121, while the other input thereof is connected to the terminal SMJ of the scan path register circuit 11j-1. The terminal SMJ is controlled by a logic value opposite the terminal SMB.

The inverter circuit I7 is connected to the first input of the second gate circuit G2SI" positioned at the front stage of the scan register 11j-1, and the terminal SMJ is connected to the second input thereof through the node N122. Except for that point, the circuit operation of FIG. 12 is the same as that of FIG. 1 and the detailed description will be omitted.

On a normal operation, the SM and SMJ signals are set to "0" and "0", respectively, while on a shift operation, the SM and SMJ signals are set to "1" and "1", respectively. Note that when the SM and SMJ signals are set to "1" and "0", respectively, a synchronous reset operation (Q="1", QC="0") is allowed by supplying a clock pulse to the signal T.

As described above, according to the embodiment 10, the same effect as that of the embodiment 1 is obtained.

EMBODIMENT 11

Figure 13:
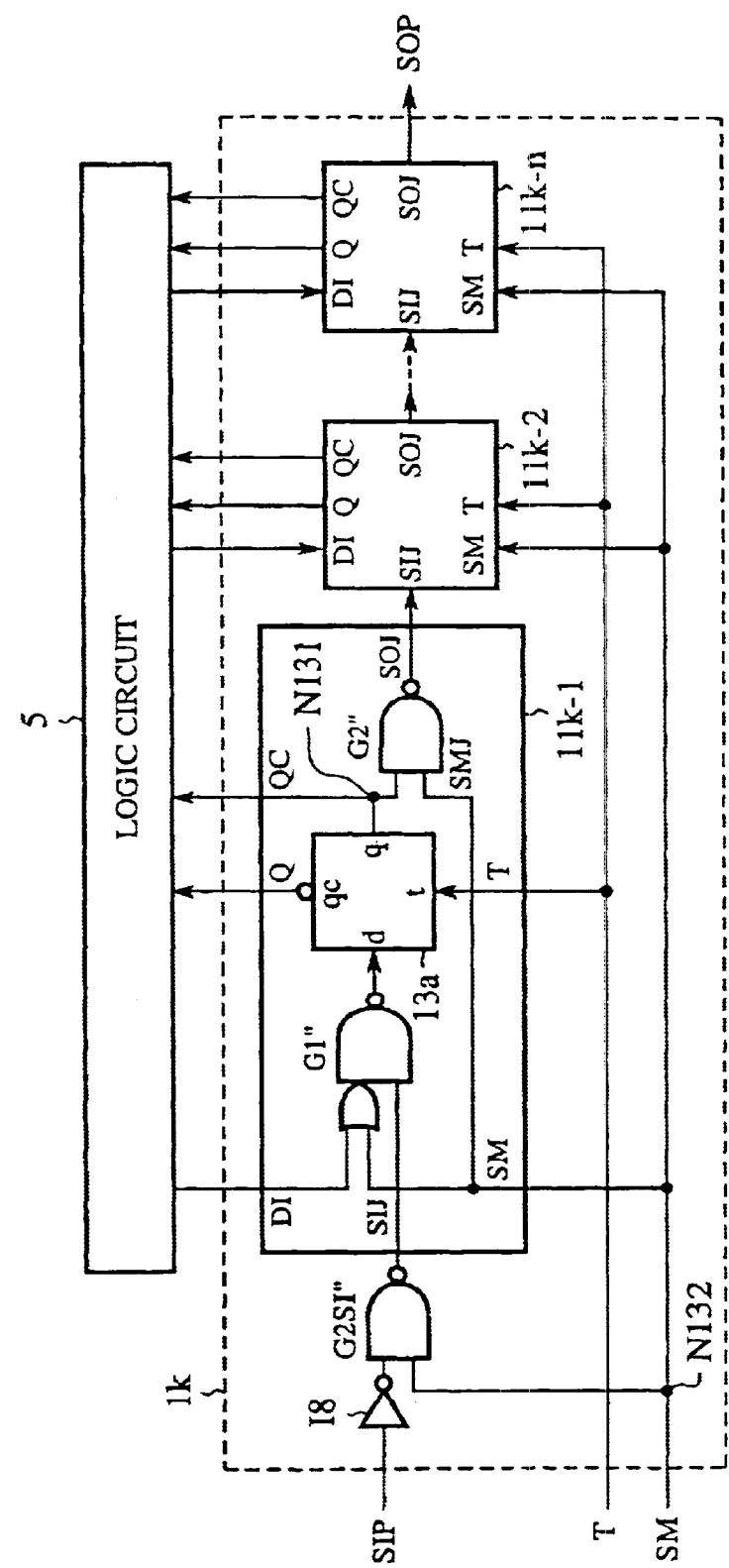
FIG. 13 is a circuit diagram showing a semiconductor integrated circuit with a scan path circuit according to an embodiment 11 of the present invention.

FIG. 13 is a circuit diagram showing a semiconductor integrated circuit with a scan path circuit according to an embodiment 11 of the present invention. In FIG. 13, the reference numeral 1k designates a scan path circuit; 11k-1 to 11k-n each designate a scan register circuit; G2" (or G2SI") designates a second gate circuit; 13a designates a flip-flop circuit as a memory circuit; I8 designates an inverter circuit; and N131–N132 each designate a node. Since other components are the same as those of the embodiment 2, the same parts are denoted by the same reference numerals and their explanation will be omitted.

This is a difference with the circuit architecture of FIG. 1 according to the embodiment 1 in that in the scan register circuit 11k-1, the second gate circuit G2" is replaced from an OR circuit to a NAND circuit; and that one input of the second gate circuit G2" is connected to the terminal q of the flip-flop circuit 13a through the node N131, while the other input thereof is connected to the terminal SM (=SMJ) of the scan path register circuit 11k-1. Then, the inverter circuit I8 is connected to the first input of the second gate circuit G2SI" positioned at the front stage of the scan register 11k-1, while the terminal SM is connected to the second input thereof through the node N132. Except for that point, the circuit operation of FIG. 13 is the same as that of FIG. 2 and the detailed description will be omitted.

On a normal operation, the SM signal is set to "0", while on a shift operation, the SM signal is set to "1". Note that in the circuit of FIG. 13, the inverter circuit I2 built in each scan register circuit is not required as compared to that of FIG. 2, thereby reducing the number of circuit elements in the entire semiconductor integrated circuit.

As described above, according to the embodiment 10, in addition to the same effect as that of the embodiment 2, the inverter circuit I2 is not required in each scan register circuit, thereby reducing the number of circuit elements due to only the inverter circuit I8 which is disposed at the front stage of the second gate circuit G2SI".

EXAMPLE 1-1

Figure 14:
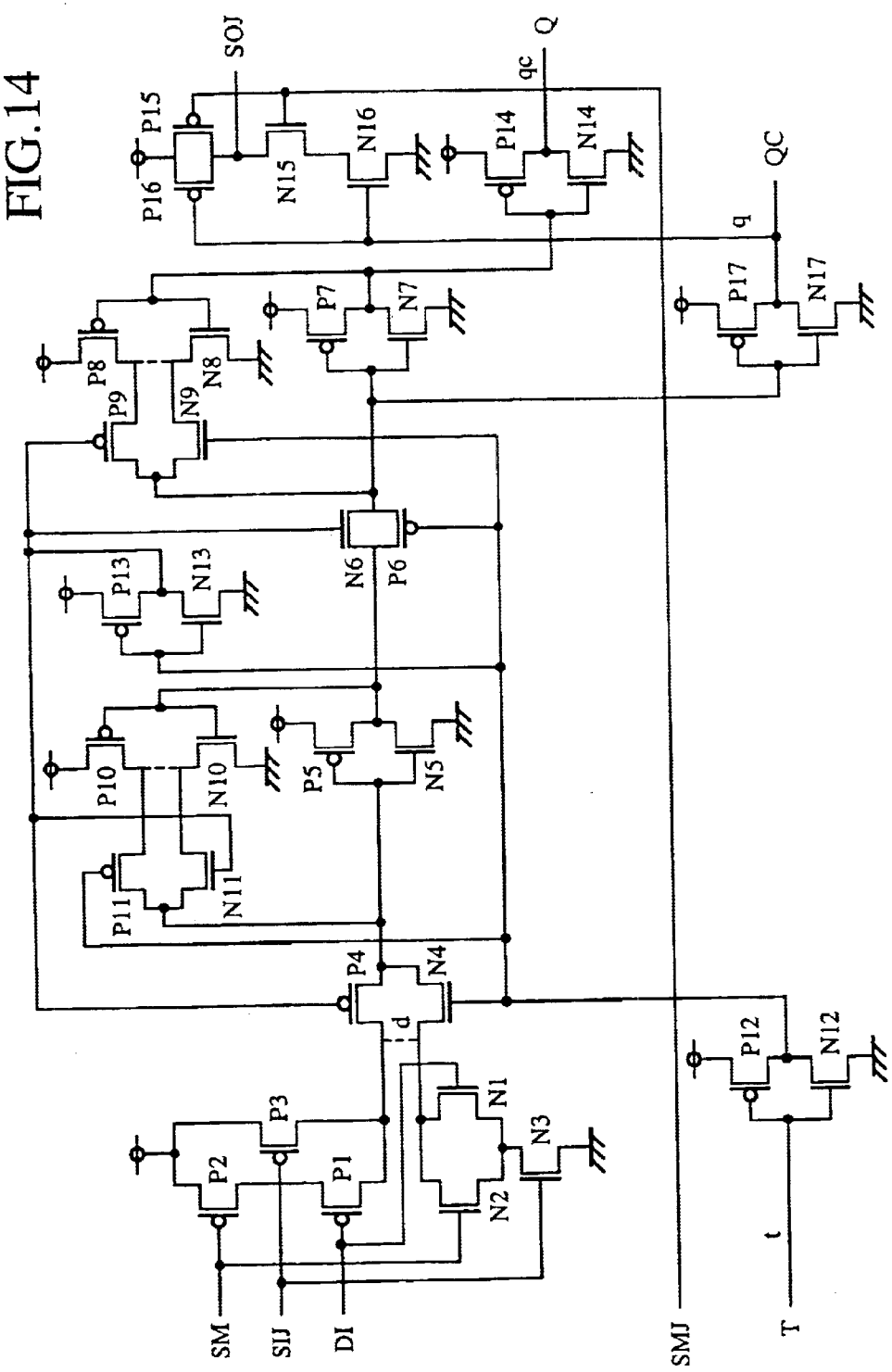
FIG. 14 is a circuit diagram showing a first example in the case of achieving a function equal to the scan register circuit by a CMOS semiconductor integrated circuit.

FIG. 14 is a circuit diagram showing the first example in which the function equal to those of the scan register circuits 1j, 1k employed in FIG. 12 or FIG. 13 is implemented by a CMOS semiconductor integrated circuit. This may be constituted in the CMOS semiconductor integrated circuit. In FIG. 14, the reference symbols N1–N17 each designate an NMOS transistor; and P1–P17 each designate a PMOS transistor. Note that the connection denoted by a dotted line may be omitted. Further, when the output Q is not required, the transistors N14 and P14 may be eliminated.

EXAMPLE 1-2

Figure 15:
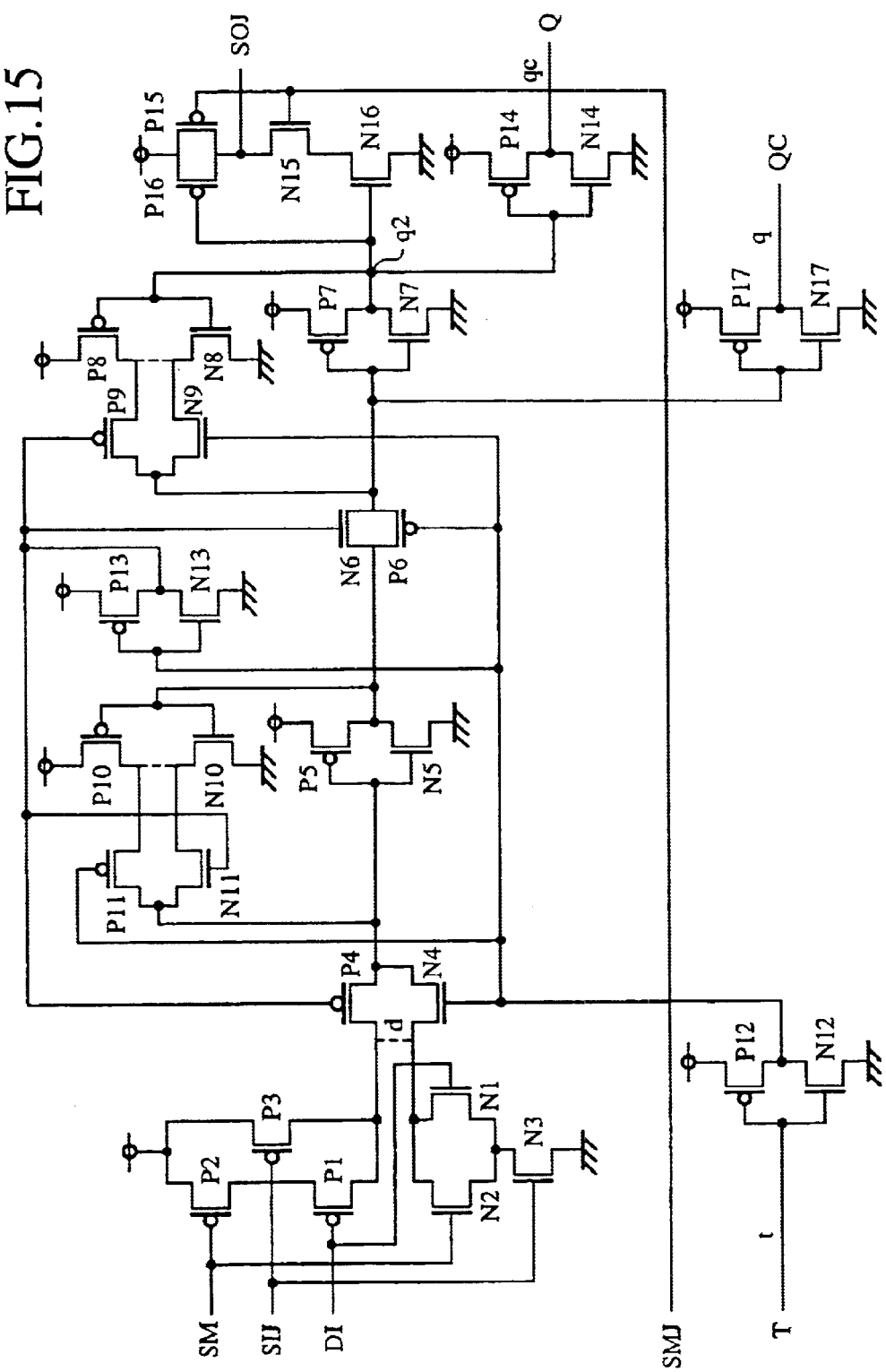
FIG. 15 is a circuit diagram showing a second example in the case of achieving a function equal to the scan register circuit by a CMOS semiconductor integrated circuit.

FIG. 15 is a circuit diagram showing the second example in which the function equal to those of the scan register circuits 1j, 1k employed in FIG. 12 or FIG. 13 is implemented by a CMOS semiconductor integrated circuit as well. In FIG. 15, the same numerals as above denote the same or corresponding parts, and the connection denoted by a dotted line will be omitted.

In the circuit of FIG. 15 as compared to that of FIG. 14, the gate input of the transistors N16 and P16 is changed from the node q to the node q2. Note that when the output Q is not required, the transistors N14 and P14 may be eliminated, while when the output QC is note required, the transistors N17 and P17 may be eliminated.

EXAMPLE 1-3

Figure 16:
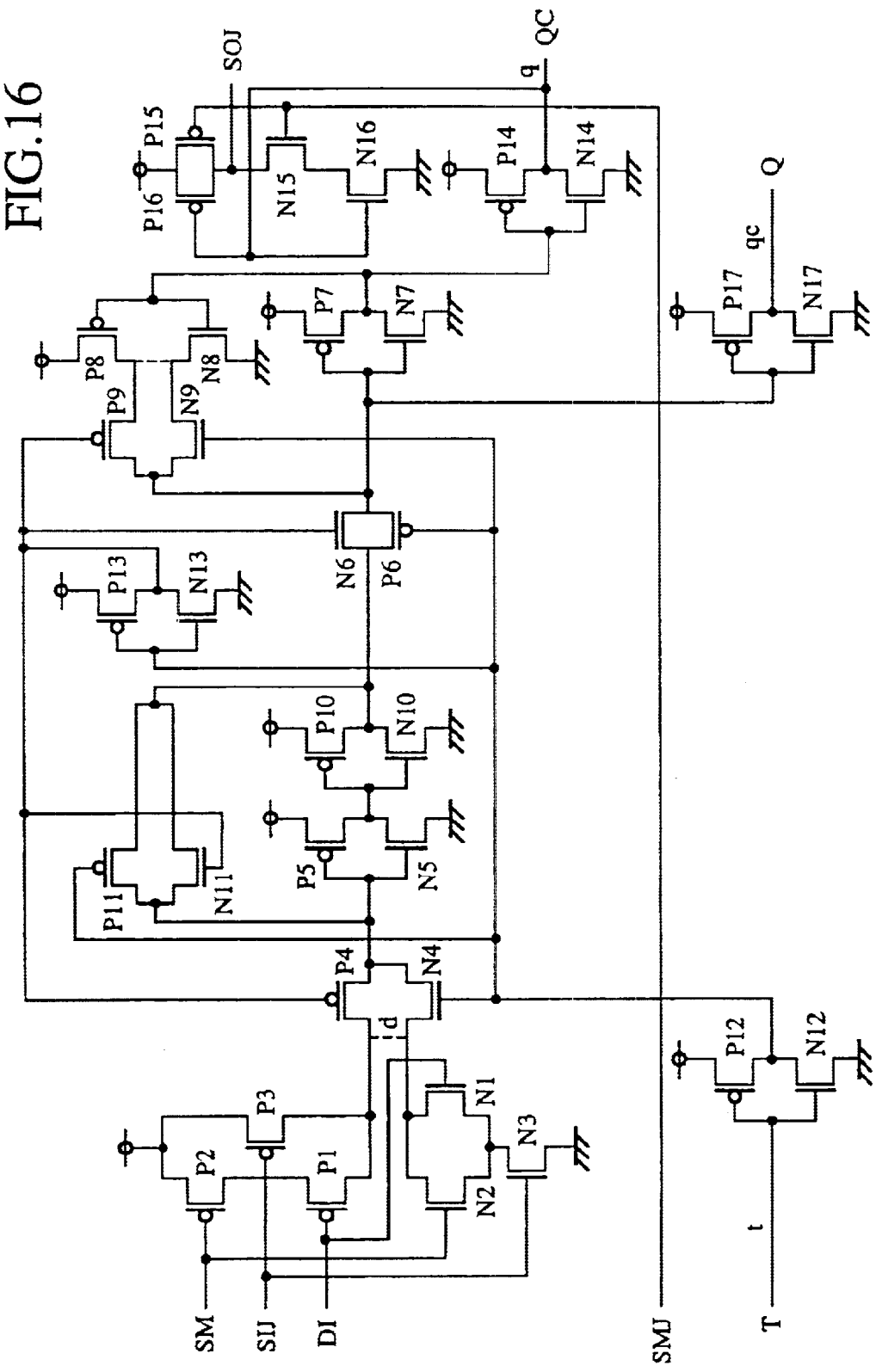
FIG. 16 is a circuit diagram showing a third example in the case of achieving a function equal to the scan register circuit by a CMOS semiconductor integrated circuit.

FIG. 16 is a circuit diagram showing the third example in which the function equal to those of the scan register circuits 1j, 1k employed in FIG. 12 or FIG. 13 is implemented by a CMOS semiconductor integrated circuit as well. In FIG. 16, the same numerals as above denote the same or corresponding parts, and the connection denoted by a dotted line will be omitted.

In the circuit of FIG. 16 as compared to that of FIG. 14, there is a difference in that the output of the inverter circuit constituted by the transistors N10 and P10 is connected to the transistors N6 and P6. Hence, since the logic is inverted, the nodes q and qc are replaced with each other. Note that when the output Q is not required, the transistors N17 and P17 will be eliminated.

EXAMPLE 1-4

Figure 17:
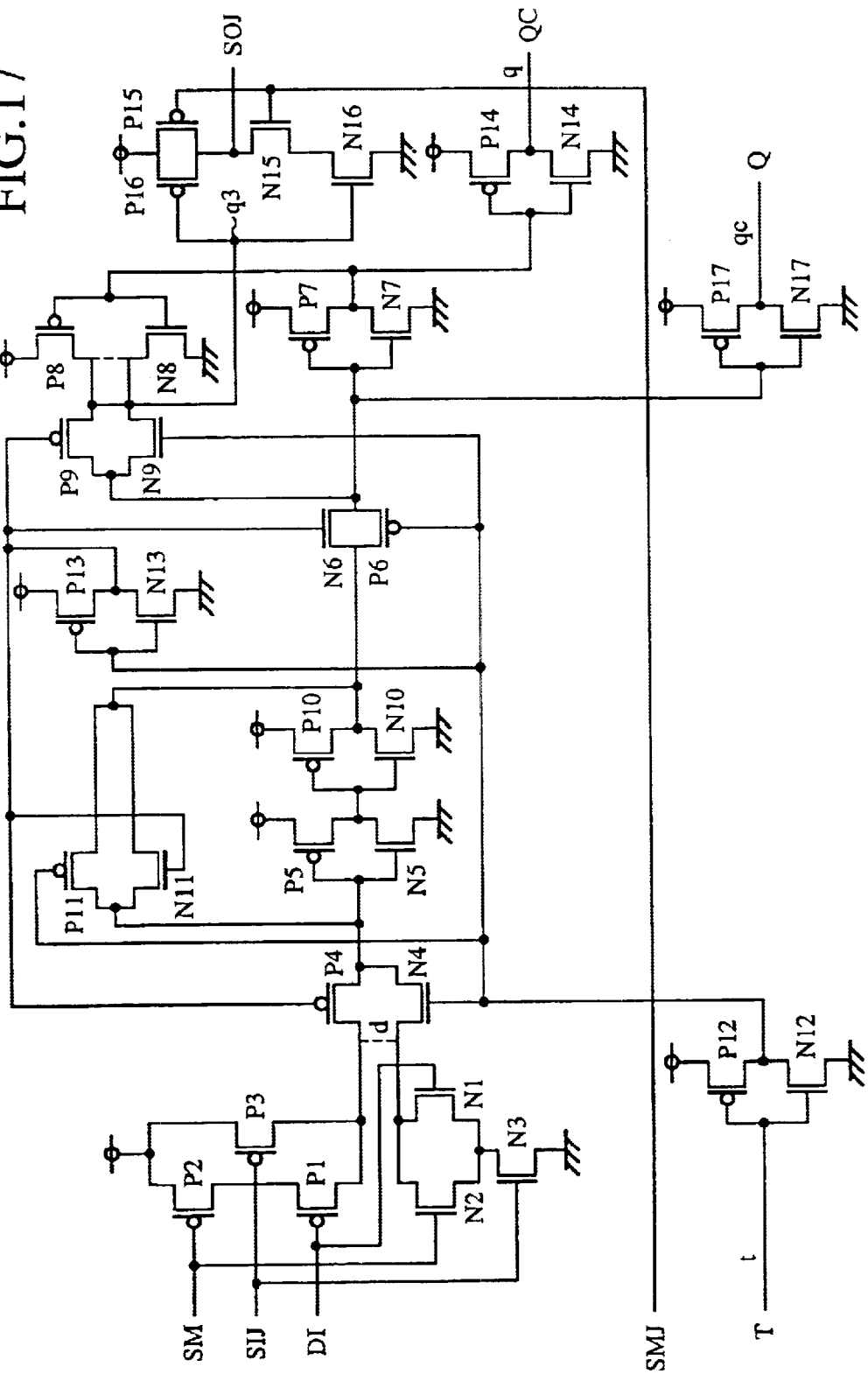
FIG. 17 is a circuit diagram showing a fourth example in the case of achieving a function equal to the scan register circuit by a CMOS semiconductor integrated circuit.

FIG. 17 is a circuit diagram showing the fourth example in which the function equal to those of the scan register circuits 1j, 1k employed in FIG. 12 or FIG. 13 is implemented by a CMOS semiconductor integrated circuit as well. In FIG. 17, the same numerals as above denote the same or corresponding parts, and the connection denoted by a dotted line will be omitted.

In the circuit of FIG. 17 as compared to that of FIG. 16, the gate input of the transistors N16 an P16 is changed from the node q to the node q3. Note that when the output Q is not required, the transistors N17 and P17 may be eliminated, while when the output QC is not required, the transistors N14 and P14 may be eliminated.

EMBODIMENT 12

Figure 18:
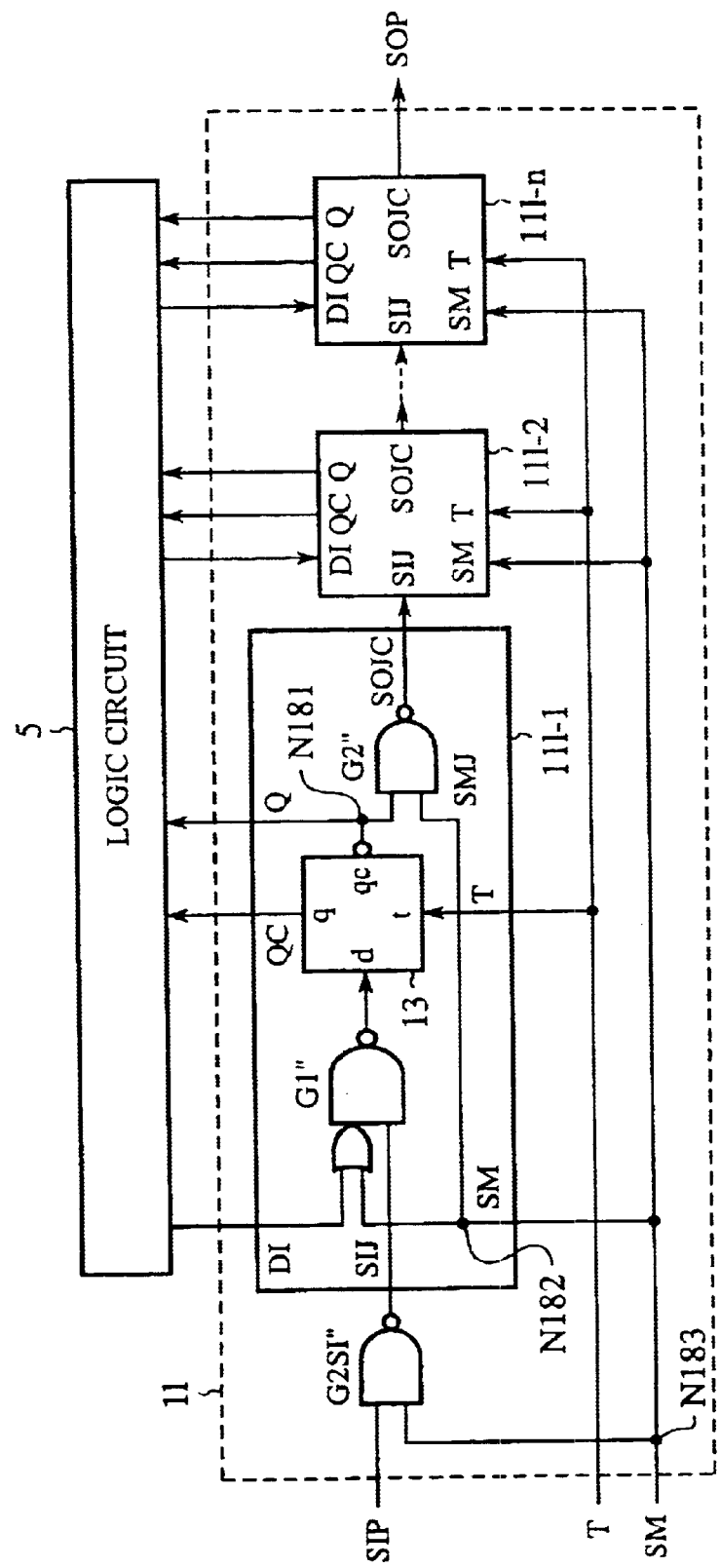
FIG. 18 is a circuit diagram showing a semiconductor integrated circuit with a scan path circuit according to an embodiment 12 of the present invention.

FIG. 18 is a circuit diagram showing a semiconductor integrated circuit with a scan path circuit according to an embodiment 12 of the present invention. In FIG. 18, the reference numeral 1l designates a scan path circuit; 11l-1 to 11l-n each designate a scan register circuit; G2" (or G2SI") designates a second gate circuit; 13 designates a flip-flop circuit as a memory circuit; and N181–N183 each designate a node. Since other components are the same as those of the embodiment 1, the same parts are denoted by the same reference numerals and their explanation will be omitted.

The circuit of FIG. 18 achieves the same scan path function as that of FIG. 12, except that the first input of the second gate circuit G2" as a NAND gate in each scan register circuit is changed from the terminal q to the terminal qc. Hence, the output terminal SOJC of each scan register circuit of FIG. 18 becomes an inversion output.

Accordingly, the data travelling in the serial path of the scan path circuit 11 are inverted every passing each scan register circuit. Taking care this matter, when the shift input of test data and the shift output of test results are performed, a scan test may be implemented as well as the prior art.

As described above, according to the embodiment 12, the same effect as that of the embodiment 10 may be obtained.

EXAMPLE 2-1

Figure 19:
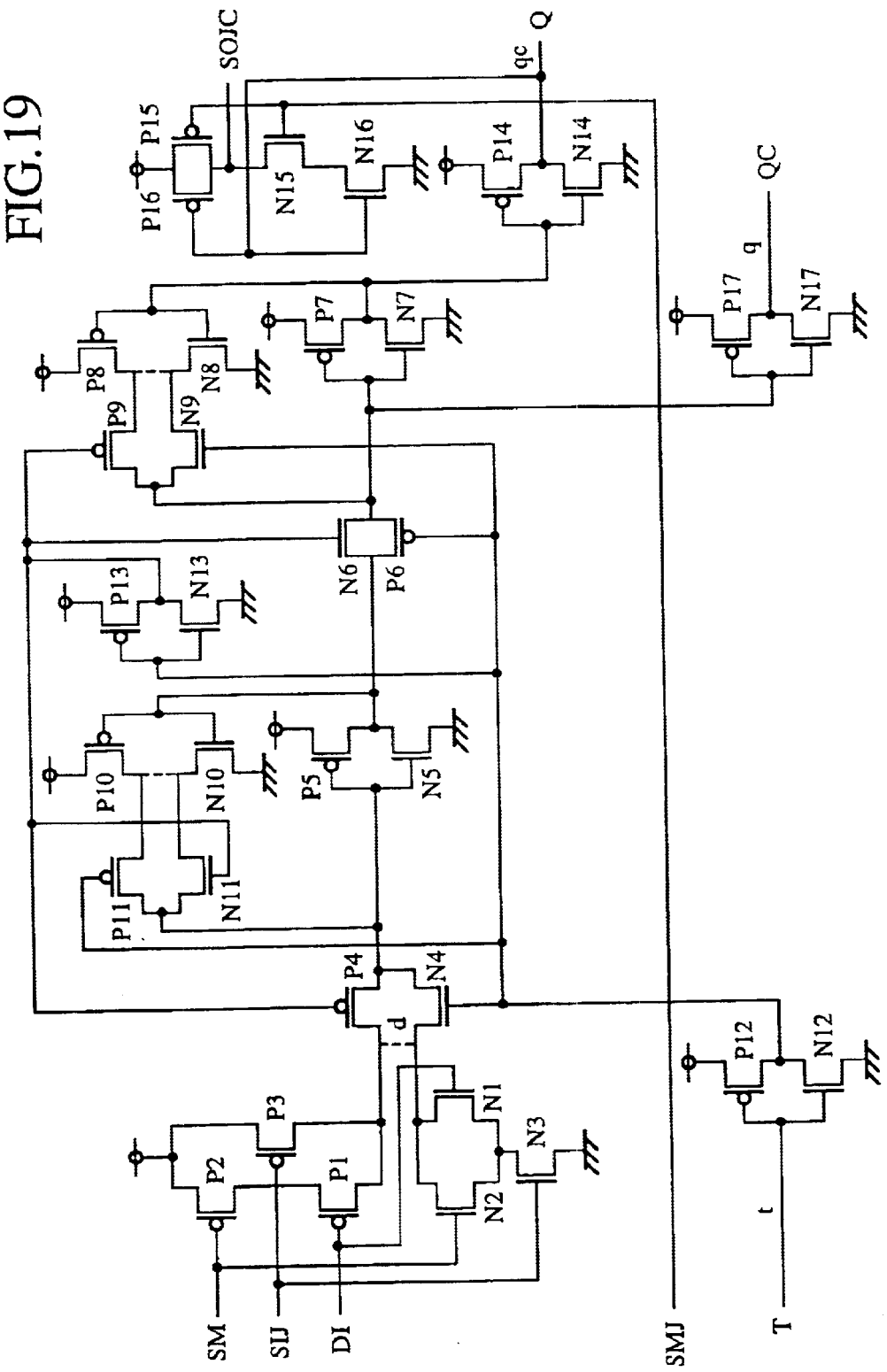
FIG. 19 is a circuit diagram showing a first example in the case of achieving a function equal to a scan register circuit 11 by a CMOS semiconductor integrated circuit.

FIG. 19 is a circuit diagram showing the first example in which the function equal to that of the scan register circuit 11 in FIG. 18 is implemented by a CMOS semiconductor integrated circuit. This may be constituted in the CMOS semiconductor integrated circuit. In FIG. 14, the reference symbols N1–N17 each designate an NMOS transistor; and P1–P17 each designate a PMOS transistor. Note that the connection denoted by a dotted line may be omitted. Further, when the output QC is not required, the transistors N17 and P17 may be eliminated.

EXAMPLE 2-2

Figure 20:
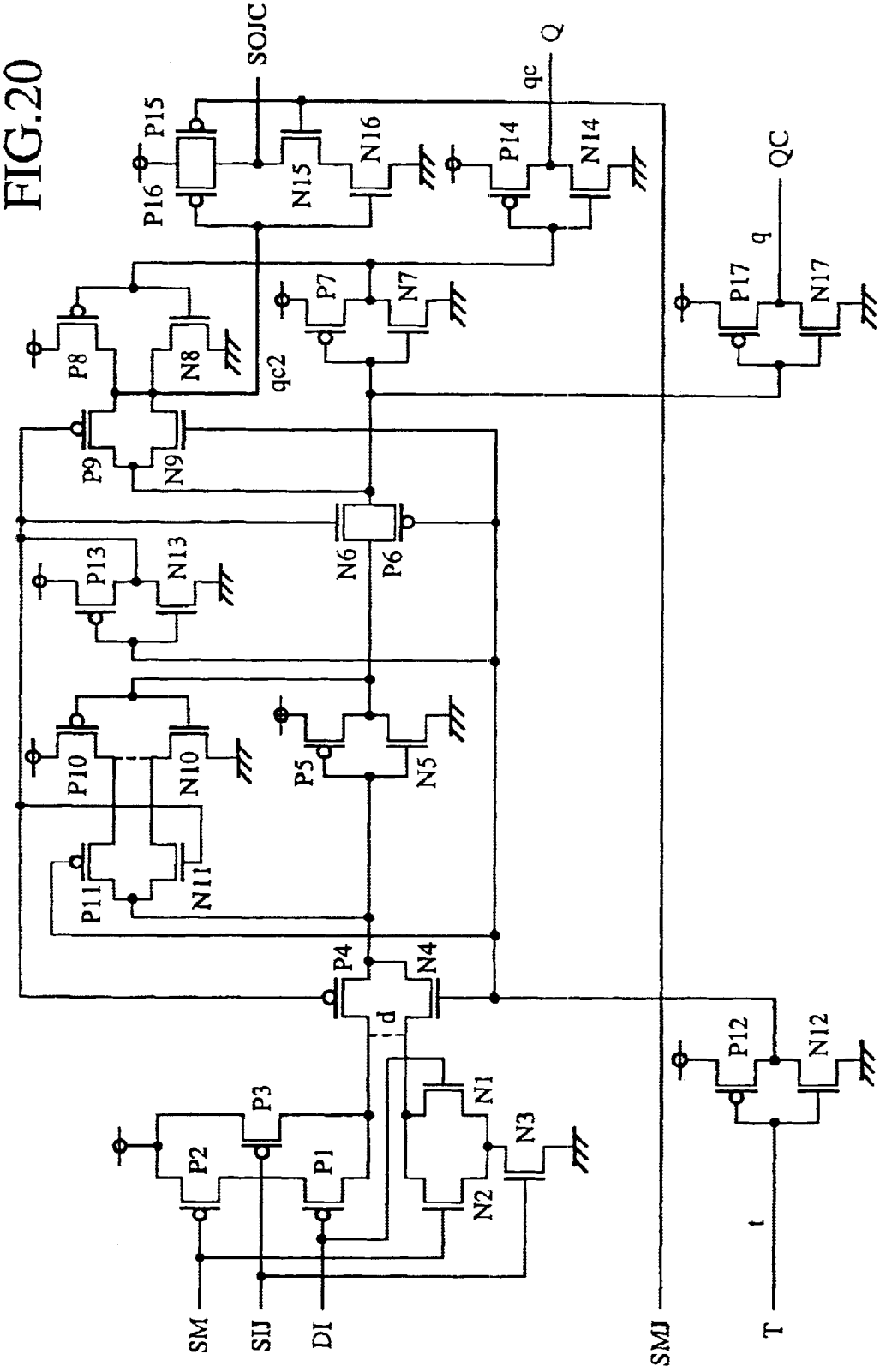
FIG. 20 is a circuit diagram showing a second example in the case of achieving a function equal to a scan register circuit 11 by a CMOS semiconductor integrated circuit.

FIG. 20 is a circuit diagram showing the second example in which the function equal to that of the scan register circuit 11 in FIG. 18 is implemented by a CMOS semiconductor integrated circuit. In FIG. 20, the same reference numerals as above denote the same components or the corresponding parts. Note that the connection denoted by a dotted line may be omitted.

In the circuit of FIG. 20 as compared to that of FIG. 19, the gate input of the transistors N16 and P16 is changed from the node qc to the node qc2. Note that when the output Q is not required, the transistors N14 and P14 may be eliminated, while when the output QC is not required, the transistors N17 and P17 may be eliminated.

What is claimed is:

1. A semiconductor integrated circuit comprising:
a scan path circuit being constituted by serially connecting a plurality of scan register circuits, each of which is constituted by an OR-NAND compound gate circuit, a flip-flop circuit, and an OR circuit; and
a logic circuit to be tested by use of said scan path circuit,
wherein a first input of OR function in said OR-NAND compound circuit is connected to said logic circuit to be tested, and a second input thereof is controlled by a first shift mode signal, while an input of the NAND function is connected to a serial input terminal, and the output thereof is connected to a data input terminal of said flip-flop circuit, and
wherein an output of said flip-flop circuit is connected to a first input of said OR circuit while a second input thereof is controlled by a second shift mode signal, and an output of said OR circuit is connected to a serial output terminal.

2. The semiconductor integrated circuit according to claim 1, wherein said scan register circuits each include an inverter circuit which outputs a second shift mode signal independent of said scan register circuit in response to the first shift mode signal.

3. The semiconductor integrated circuit according to claim 1, wherein said scan register circuits each include an inverter circuit which outputs a first shift mode signal independent of said scan register circuit in response to the second shift mode signal.

4. A semiconductor integrated circuit comprising:
a scan path circuit being constituted by serially connecting a plurality of scan register circuits, each of which is constituted by an OR-NAND compound gate circuit, a flip-flop circuit, and a NAND circuit; and
a logic circuit to be tested by use of said scan path circuit,
wherein a first input of OR function in said OR-NAND compound circuit is connected to said logic circuit to be tested, and a second input thereof is controlled by a first shift mode signal, while an input of the NAND function is connected to a serial input terminal, and the output thereof is connected to a data input terminal of said flip-flop circuit, and
wherein an output of said flip-flop circuit is connected to a first input of said NAND circuit while a second input thereof is controlled by a second shift mode signal, and an output of said NAND circuit is connected to a serial output terminal.

5. The semiconductor integrated circuit according to claim 4, wherein the first shift mode signal is identical to the second shift mode signal.

6. The semiconductor integrated circuit according to claim 4, wherein the flip-flop circuit has at least two output terminals which output the same logic data, and any one of these terminals is connected to the second input of said NAND circuit.

7. A semiconductor integrated circuit comprising:
a logic circuit to be tested by a scan test; and
a scan path circuit being constituted by serially connecting a plurality of scan register circuits, each of which includes a compound gate circuit having a first logic gate and a second logic gate, a flip-flop circuit connecting an output of said compound gate circuit to a data input terminal, and a gate circuit connecting a first input thereof to a data output terminal of said flip-flop circuit and connecting a second input thereof to a second connection terminal input by a second shift mode signal, and which connects said compound gate circuit, flip-flop circuit, and gate circuit in this turn,
wherein a first input of said first logic gate is connected to said logic circuit to be tested, and a second input thereof is connected to a first connection terminal input by a first shift mode signal, while a first input of said second logic gate is connected to an output of said first logic gate and a second input thereof is connected to a serial input terminal.

8. The semiconductor integrated circuit according to claim 7, wherein a second input of said second logic gate in the scan register circuit at a first stage is connected to an output of another gate circuit connecting its first input to one of shift mode signals.

9. A semiconductor integrated circuit device having a semiconductor integrated circuit comprising:
a logic circuit to be tested by a scan test; and
a scan path circuit being constituted by serially connecting a plurality of scan register circuits, each of which includes a compound gate circuit having a first logic gate and a second logic gate, a flip-flop circuit connecting an output of said compound gate circuit to a data input terminal, and a gate circuit connecting a first input thereof to a data output terminal of said flip-flop circuit and connecting a second input thereof to a second connection terminal input by a second shift mode signal, and which connects said compound gate circuit, flip-flop circuit, and gate circuit in this turn,
wherein a first input of said first logic gate is connected to said logic circuit to be tested, and a second input thereof is connected to a first connection terminal input by a first shift mode signal, while a first input of said second logic gate is connected to an output of said first logic gate and a second input thereof is connected to a serial input terminal, and wherein an output terminal of non-inversion or inversion prepared for said flip-flop circuit is electrically connected to first and second wires which output the same logic data, and said first and second wires electrically connect said circuit to be tested and a first input of the gate circuit in the scan register circuit, respectively.

* * * * *